US012732304B2

(12) United States Patent
Ivanov et al.

(10) Patent No.: US 12,732,304 B2
(45) Date of Patent: Sep. 8, 2026

(54) SOFT COMBINING BASED ON AUTOMORPHISMS OF POLAR CODES

(71) Applicant: QUALCOMM Incorporated, San Diego, CA (US)

(72) Inventors: Kirill Ivanov, La Jolla, CA (US); Wei Yang, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 295 days.

(21) Appl. No.: 18/606,274

(22) Filed: Mar. 15, 2024

(65) Prior Publication Data

US 2025/0293803 A1 Sep. 18, 2025

(51) Int. Cl.
*H04L 1/00* (2006.01)
*H03M 13/19* (2006.01)

(52) U.S. Cl.
CPC .......... *H04L 1/0057* (2013.01); *H03M 13/19* (2013.01)

(58) Field of Classification Search
CPC ......... H04L 1/00; H04L 1/004; H04L 1/0056; H04L 1/0057; H04L 9/0858; H04L 2012/5672–5673; H04L 1/0008; H04L 1/0042; H04L 1/0076; H03M 13/00; H03M 13/03; H03M 13/05; H03M 13/19; H03M 1/301; H03M 7/4087; H03M 13/611; H03M 13/13
See application file for complete search history.

(56) References Cited

U.S. PATENT DOCUMENTS

2016/0182187 A1* 6/2016 Kim .................. H03M 13/6525 714/807
2018/0062797 A1* 3/2018 Yang ......................... H04L 1/00
(Continued)

FOREIGN PATENT DOCUMENTS

CN 106998208 * 1/2017 ............ H03M 13/13
WO WO-2017196391 A1 * 11/2017 ............ H03M 13/13
WO WO-2018175711 A1 * 9/2018 ........ H03M 13/2789

OTHER PUBLICATIONS

Huawei, et al., "Polar Code for PBCH and Soft Combining", 3GPP TSG RAN WG1 Meeting NR#3, R1-1715499, 3rd Generation Partnership Project, Mobile Competence Centre, 650, Route Des Lucioles, F-06921 Sophia-Antipolis Cedex, France, vol. RAN WG1, No. Nagoya, Japan Sep. 18, 2017-Sep. 21, 2017, Sep. 17, 2017, 13 Pages, XP051338967, the whole document.
(Continued)

*Primary Examiner* — Warner Wong
(74) *Attorney, Agent, or Firm* — Patterson + Sheridan, L.L.P.

(57) ABSTRACT

Certain aspects of the present disclosure provide techniques for soft combining of polar encoded transmissions. An example method, performed at a network node, generally includes obtaining multiple codeword permutations corresponding to different payloads, wherein the different payloads comprise first payload portions that are the same and second payload portions that differ in a deterministic manner, and each codeword permutation corresponds to one of the second payload portions, processing the multiple codeword permutations to obtain the second payload portions, obtaining the first payload portions after obtaining the second payload portions, and soft combining the first payload portions.

21 Claims, 15 Drawing Sheets

(56) References Cited

U.S. PATENT DOCUMENTS

| | | | | |
|---|---|---|---|---|
| 2018/0375612 | A1 | 12/2018 | Sarkis et al. | |
| 2019/0296857 | A1* | 9/2019 | Gritsenko | H03M 13/3769 |
| 2019/0356420 | A1* | 11/2019 | John Wilson | H04B 7/0408 |
| 2020/0059245 | A1* | 2/2020 | Zhang | H03M 13/635 |
| 2020/0067533 | A1* | 2/2020 | Wang | H03M 13/2778 |
| 2020/0067536 | A1* | 2/2020 | Luo | H04L 1/0061 |
| 2020/0083984 | A1* | 3/2020 | Shen | H04L 1/0046 |
| 2020/0235755 | A1* | 7/2020 | Luo | H04L 1/0041 |
| 2023/0387940 | A1 | 11/2023 | Bioglio et al. | |
| 2024/0022351 | A1* | 1/2024 | Iqbal | H03M 13/635 |
| 2024/0333426 | A1* | 10/2024 | Zhang | H03M 13/255 |
| 2025/0070919 | A1* | 2/2025 | Huang | H03M 13/356 |
| 2025/0080137 | A1* | 3/2025 | Arikan | H03M 13/21 |
| 2025/0293803 | A1* | 9/2025 | Ivanov | H04L 1/0057 |

OTHER PUBLICATIONS

International Search Report and Written Opinion—PCT/US2025/016278—ISA/EPO—May 20, 2025.

Luo H., et al., "Analysis and Application of Permuted Polar Codes", 2018 IEEE Global Communications Conference (GLOBECOM), IEEE, Dec. 9, 2018, 5 pages, XP033519886, the whole document.

Stolte N., "Rekursive Codes Mit Der Plotkin-Konstruktion and Ihre Decodierung", Jan. 1, 2002, 152 Pages, XP055241445, sections 4.2 and 5.4.

Zte, et al., "Consideration on Polar Codes for NR", R1-1608975, 3GPP TSG RAN WG1 #86bis, Lisbon, Portugal, Oct. 10-14, 2016, pp. 1-8.

* cited by examiner

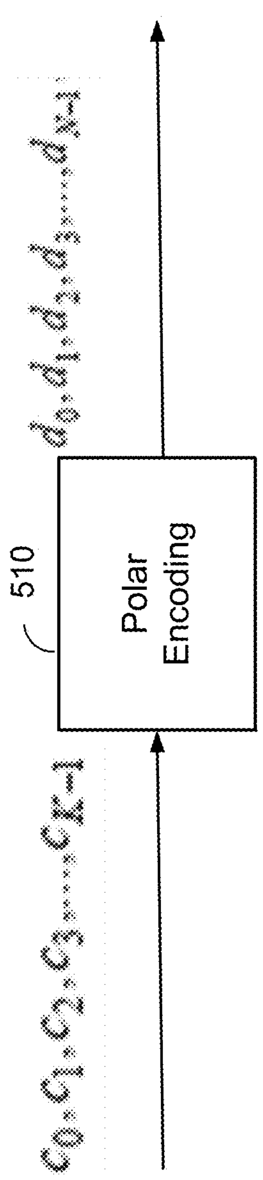
FIG. 5
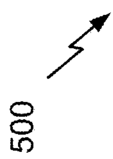

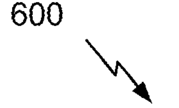
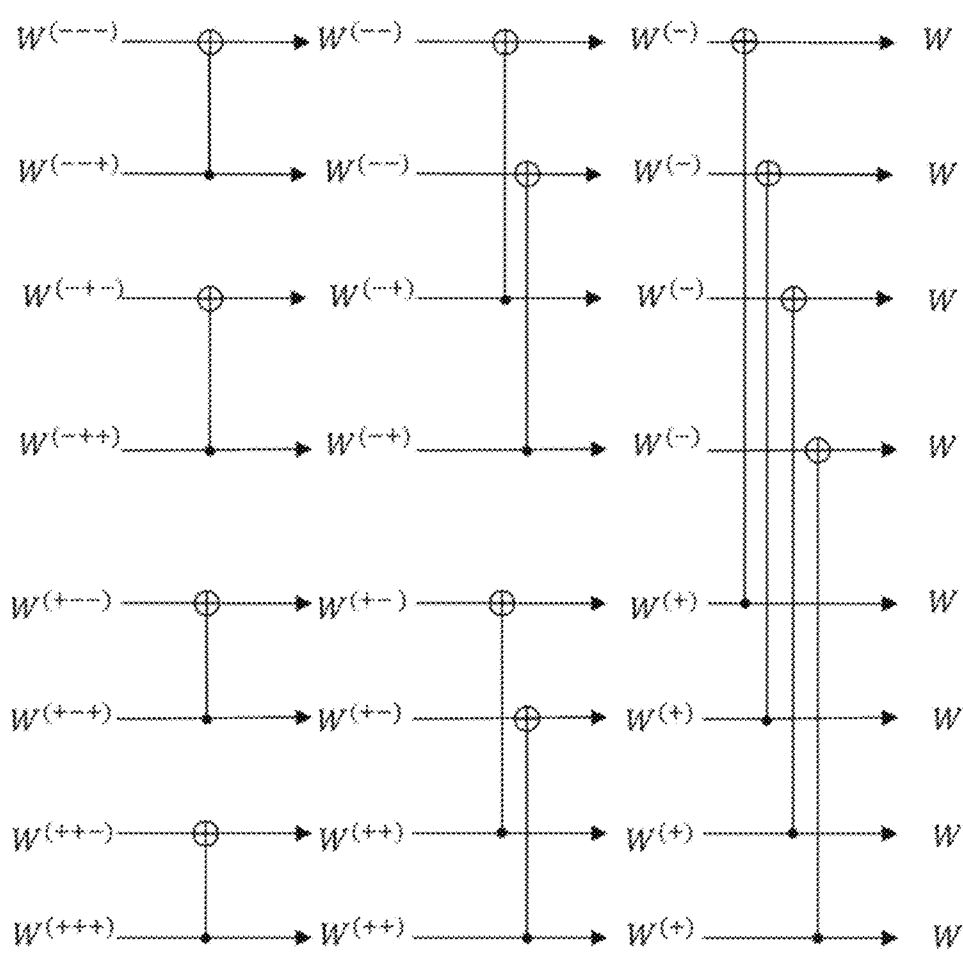
FIG. 6

700
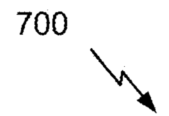
FIG. 7

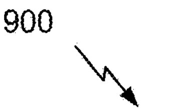
$$A = \begin{pmatrix} A' & 0 \\ * & A'' \end{pmatrix}$$
FIG. 9A
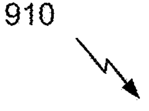
912
914
$$A = \begin{pmatrix} 1 & 0 & 0 & 0 \\ * & 1 & 0 & 0 \\ * & * & * & 1 \\ * & * & 1 & 0 \end{pmatrix}$$
FIG. 9B
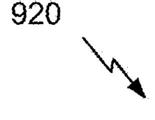
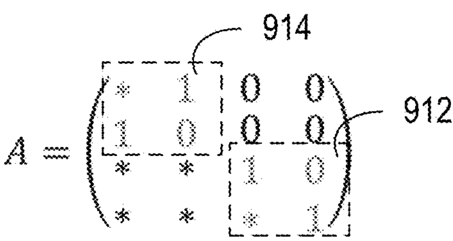
$$A = \begin{pmatrix} * & 1 & 0 & 0 \\ 1 & 0 & 0 & 0 \\ * & * & 1 & 0 \\ * & * & * & 1 \end{pmatrix}$$
FIG. 9C
FIG. 9

1000

$$N = 16, K = 4$$

$$A = \begin{pmatrix} 1 & 0 & 0 & 0 \\ 0 & 1 & 0 & 0 \\ 0 & 0 & 0 & 1 \\ 0 & 0 & 1 & 0 \end{pmatrix}, b = (0\ 0\ 0\ 0)$$

1010

$$P_x = (0, 1, 2, 3, 8, 9, 10, 11, 4, 5, 6, 7, 12, 13, 14, 15)$$

$$T_u: u_4 \leftrightarrow u_8, u_5 \leftrightarrow u_9, u_6 \leftrightarrow u_{10}, u_7 \leftrightarrow u_{11}$$

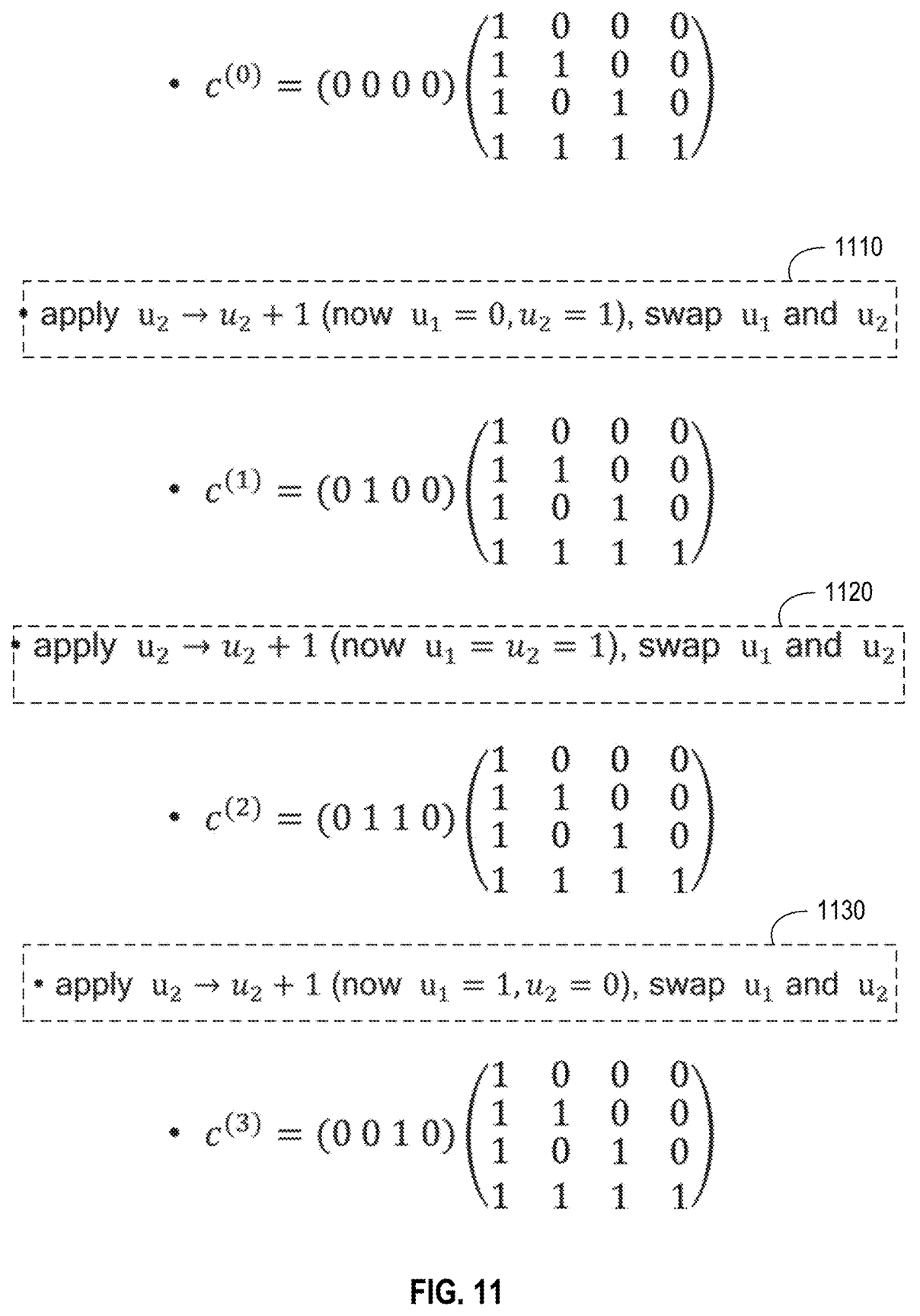

- $c^{(0)} = (0\ 0\ 0\ 0)\begin{pmatrix}1 & 0 & 0 & 0\\ 1 & 1 & 0 & 0\\ 1 & 0 & 1 & 0\\ 1 & 1 & 1 & 1\end{pmatrix}$

1110

- apply $\mathrm{u}_2 \to u_2 + 1$ (now $\mathrm{u}_1 = 0, u_2 = 1$), swap $\mathrm{u}_1$ and $\mathrm{u}_2$

- $c^{(1)} = (0\ 1\ 0\ 0)\begin{pmatrix}1 & 0 & 0 & 0\\ 1 & 1 & 0 & 0\\ 1 & 0 & 1 & 0\\ 1 & 1 & 1 & 1\end{pmatrix}$

1120

- apply $\mathrm{u}_2 \to u_2 + 1$ (now $\mathrm{u}_1 = u_2 = 1$), swap $\mathrm{u}_1$ and $\mathrm{u}_2$

- $c^{(2)} = (0\ 1\ 1\ 0)\begin{pmatrix}1 & 0 & 0 & 0\\ 1 & 1 & 0 & 0\\ 1 & 0 & 1 & 0\\ 1 & 1 & 1 & 1\end{pmatrix}$

1130

- apply $\mathrm{u}_2 \to u_2 + 1$ (now $\mathrm{u}_1 = 1, u_2 = 0$), swap $\mathrm{u}_1$ and $\mathrm{u}_2$

- $c^{(3)} = (0\ 0\ 1\ 0)\begin{pmatrix}1 & 0 & 0 & 0\\ 1 & 1 & 0 & 0\\ 1 & 0 & 1 & 0\\ 1 & 1 & 1 & 1\end{pmatrix}$

FIG. 11

SOFT COMBINING BASED ON AUTOMORPHISMS OF POLAR CODES

FIELD OF THE DISCLOSURE

Aspects of the present disclosure relate to wireless communications, and more particularly, to techniques for enabling soft combining of transmissions sent using polar encoding.

DESCRIPTION OF RELATED ART

Wireless communications systems are widely deployed to provide various telecommunication services such as telephony, video, data, messaging, broadcasts, or other similar types of services. These wireless communications systems may employ multiple-access technologies capable of supporting communications with multiple users by sharing available wireless communications system resources with those users.

Although wireless communications systems have made great technological advancements over many years, challenges still exist. For example, complex and dynamic environments can still attenuate or block signals between wireless transmitters and wireless receivers. Accordingly, there is a continuous desire to improve the technical performance of wireless communications systems, including, for example: improving speed and data carrying capacity of communications, improving efficiency of the use of shared communications mediums, reducing power used by transmitters and receivers while performing communications, improving reliability of wireless communications, avoiding redundant transmissions and/or receptions and related processing, improving the coverage area of wireless communications, increasing the number and types of devices that can access wireless communications systems, increasing the ability for different types of devices to intercommunicate, increasing the number and type of wireless communications mediums available for use, and the like. Consequently, there exists a need for further improvements in wireless communications systems to overcome the aforementioned technical challenges and others.

SUMMARY

One aspect provides a method for wireless communications at a first wireless node. The method includes encoding different payloads, using polar codes, to generate multiple codeword permutations, wherein each of the different payloads comprises a first payload portion that is the same for the different payloads and a second payload portion that differs among the different payloads in a deterministic manner, and each codeword permutation corresponds to one of the second payload portions; and outputting the multiple codeword permutations sequentially.

Another aspect provides a method for wireless communications at a first wireless node. The method includes obtaining multiple codeword permutations corresponding to different payloads, wherein the different payloads comprise first payload portions that are the same and second payload portions that differ in a deterministic manner, and each codeword permutation corresponds to one of the second payload portions; processing the multiple codeword permutations to obtain the second payload portions; obtaining the first payload portions after obtaining the second payload portions; and soft combining of the first payload portions.

Other aspects provide: an apparatus operable, configured, or otherwise adapted to perform any one or more of the aforementioned methods and/or those described elsewhere herein; a non-transitory, computer-readable media comprising instructions that, when executed (e.g., directly, indirectly, after pre-processing, without pre-processing) by one or more processors of an apparatus, cause the apparatus to perform the aforementioned methods as well as those described elsewhere herein; a computer program product embodied on a computer-readable storage medium comprising code for performing the aforementioned methods as well as those described elsewhere herein; and/or an apparatus comprising means for performing the aforementioned methods as well as those described elsewhere herein. By way of example, an apparatus may comprise a processing system, a device with a processing system, or processing systems cooperating over one or more networks.

The following description and the appended figures set forth certain features for purposes of illustration.

BRIEF DESCRIPTION OF DRAWINGS

The appended figures depict certain features of the various aspects described herein and are not to be considered limiting of the scope of this disclosure.

FIG. 5 is a block diagram illustrating a process related to polar encoding.

FIG. 6 depicts an example of polar coding.

FIG. 7 depicts an example of received samples for a physical broadcast channel (PBCH).

FIGS. 9A, 9B, and 9C depict example permutation matrices, in accordance with aspects of the present disclosure.

FIG. 11 depicts an example of sequentially generated codeword permutations, in accordance with aspects of the present disclosure.

DETAILED DESCRIPTION

Figure 1:
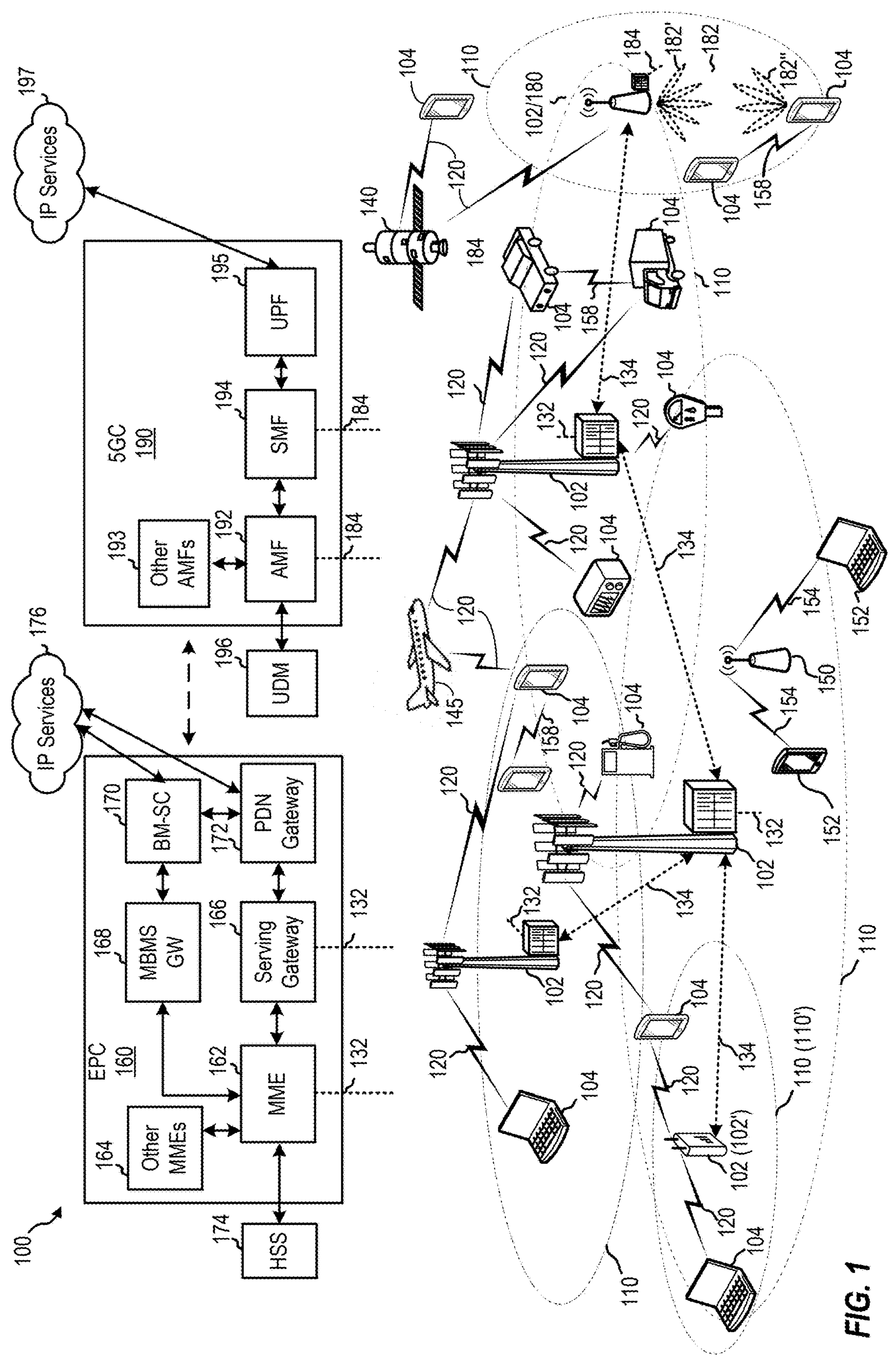
FIG. 1 depicts an example wireless communications network.

Aspects of the present disclosure relate to wireless communications, and more particularly, to techniques for enabling soft combining of transmissions sent using polar encoding.

Polar codes are a relatively recent breakthrough in coding theory which may help optimize wireless channel transmission. For example, polar coding has been proven to asymptotically (for code size N approaching infinity) achieve channel capacity for a finite-bandwidth continuous-time channel subject to Gaussian noise (referred to as the Shannon capacity). Polar codes have many desirable properties such as deterministic construction (e.g., based on a fast Hadamard transform), very low and predictable error floors, and simple successive-cancellation (SC) based decoding. They are currently being considered and utilized for error-correction in next-generation wireless systems, such as new radio (NR).

With polar coding, a codeword may be generated (e.g., by an encoder) by using the generator matrix to encode a number of input bits consisting of K information bits and N-K "frozen" bits which contain no information and are "frozen" to a known value, such as zero. For example, given a number of input bits $u=(u_0, u_1, \ldots, u_{N-1})$, a resulting codeword vector $x=(x_0, x_1, \ldots, x_{N-1})$ may be generated by encoding the input bits using the generator matrix G. This resulting codeword may then be transmitted by a base station over a wireless medium and received by a UE.

Polar codes essentially transform a wireless channel into N parallel "virtual" channels for the N information and frozen bits. If C is the capacity of the channel, then, for sufficiently large values of N, there are almost N*C channels which are extremely reliable and there are almost N(1−C) channels which are extremely unreliable. The basic polar coding scheme then involves freezing (i.e., setting to a known value, such as zero) the input bits in u corresponding to the unreliable channels, while placing information bits only in the bits of u corresponding to reliable channels.

Soft combining is a feature that allows a receiver to combine multiple received signal instances. This combining may help improve signal quality and increase the chances of successful decoding, even when some of the received instances are corrupted during transmission. Soft combining relies on the payload of consecutive transmissions to be the same. Certain types of transmissions may not be ideal candidates for soft combining, due to portions of the payload that change in consecutive transmissions. For example, a physical broadcast channel (PBCH) in NR has a payload with a certain portion that changes across transmissions. While polar coding may be used for PBCH transmissions (e.g., with fixed parameters of N=512, K=56 including a 24-bit checksum), a system frame number (SFN) included in the payload content (currently a 10-bit value), is consecutively increased by 1 (modulo 1024).

Unfortunately, the changing nature of the SFN portion of PBCH payload creates a challenge to soft combining of several consecutive transmissions, as the UE may not know a starting value (of SFN) in the received PBCH sample sequence. As a result, the UE may need to guess the starting point (of SFN in the received samples) and perform several decoding attempts, which is inefficient and may lead to increased power consumption.

Aspects of the present disclosure, however, provide a coding scheme that helps enable soft combine of multiple payloads even when the payloads differ in a number of bits. For example, the coding scheme proposed herein may help enable soft combining of multiple PBCH payloads, when a channel code is fixed and the payloads differ in a relatively small number of bits (e.g., SFN/counter bits). Counter bits that increment periodically (before rolling over) are one example of payload bits that may differ in a deterministic manner.

Particular aspects of the subject matter described in this disclosure can be implemented to realize one or more of the following potential advantages. In some examples, the coding scheme proposed herein may allow for soft combining of PBCH transmissions sent with polar coding. As a result, the coding scheme proposed herein may help increase the chances of successful decoding, while limiting blind decoding and the corresponding increase in processing overhead and power consumption.

Introduction to Wireless Communications Networks

The techniques and methods described herein may be used for various wireless communications networks. While aspects may be described herein using terminology commonly associated with 3G, 4G, and/or 5G wireless technologies, aspects of the present disclosure may likewise be applicable to other communications systems and standards not explicitly mentioned herein.

FIG. 1 depicts an example of a wireless communications network 100, in which aspects described herein may be implemented.

Generally, wireless communications network 100 includes various network entities (alternatively, network elements or network nodes). A network entity is generally a communications device and/or a communications function performed by a communications device (e.g., a user equipment (UE), a base station (BS), a component of a BS, a server, etc.). For example, various functions of a network as well as various devices associated with and interacting with a network may be considered network entities. Further, wireless communications network 100 includes terrestrial aspects, such as ground-based network entities (e.g., BSs 102), and non-terrestrial aspects, such as satellite 140 and aircraft 145, which may include network entities on-board (e.g., one or more BSs) capable of communicating with other network elements (e.g., terrestrial BSs) and user equipments.

In the depicted example, wireless communications network 100 includes BSs 102, UEs 104, and one or more core networks, such as an Evolved Packet Core (EPC) 160 and 5G Core (5GC) network 190, which interoperate to provide communications services over various communications links, including wired and wireless links.

FIG. 1 depicts various example UEs 104, which may more generally include: a cellular phone, smart phone, session initiation protocol (SIP) phone, laptop, personal digital assistant (PDA), satellite radio, global positioning system, multimedia device, video device, digital audio player, camera, game console, tablet, smart device, wearable device, vehicle, electric meter, gas pump, large or small kitchen appliance, healthcare device, implant, sensor/actuator, display, internet of things (IoT) devices, always on (AON) devices, edge processing devices, or other similar devices. UEs 104 may also be referred to more generally as a mobile device, a wireless device, a wireless communications device, a station, a mobile station, a subscriber station, a mobile subscriber station, a mobile unit, a subscriber unit, a wireless unit, a remote unit, a remote device, an access terminal, a mobile terminal, a wireless terminal, a remote terminal, a handset, and others.

BSs 102 wirelessly communicate with (e.g., transmit signals to or receive signals from) UEs 104 via communications links 120. The communications links 120 between BSs 102 and UEs 104 may include uplink (UL) (also referred to as reverse link) transmissions from a UE 104 to a BS 102 and/or downlink (DL) (also referred to as forward link) transmissions from a BS 102 to a UE 104. The communications links 120 may use multiple-input and multiple-output (MIMO) antenna technology, including spatial multiplexing, beamforming, and/or transmit diversity in various aspects.

BSs 102 may generally include: a NodeB, enhanced NodeB (eNB), next generation enhanced NodeB (ng-eNB), next generation NodeB (gNB or gNodeB), access point, base transceiver station, radio base station, radio transceiver, transceiver function, transmission reception point, and/or others. Each of BSs 102 may provide communications coverage for a respective geographic coverage area 110, which may sometimes be referred to as a cell, and which may overlap in some cases (e.g., small cell 102' may have a coverage area 110' that overlaps the coverage area 110 of a macro cell). A BS may, for example, provide communications coverage for a macro cell (covering relatively large geographic area), a pico cell (covering relatively smaller geographic area, such as a sports stadium), a femto cell (relatively smaller geographic area (e.g., a home)), and/or other types of cells.

Figure 2:
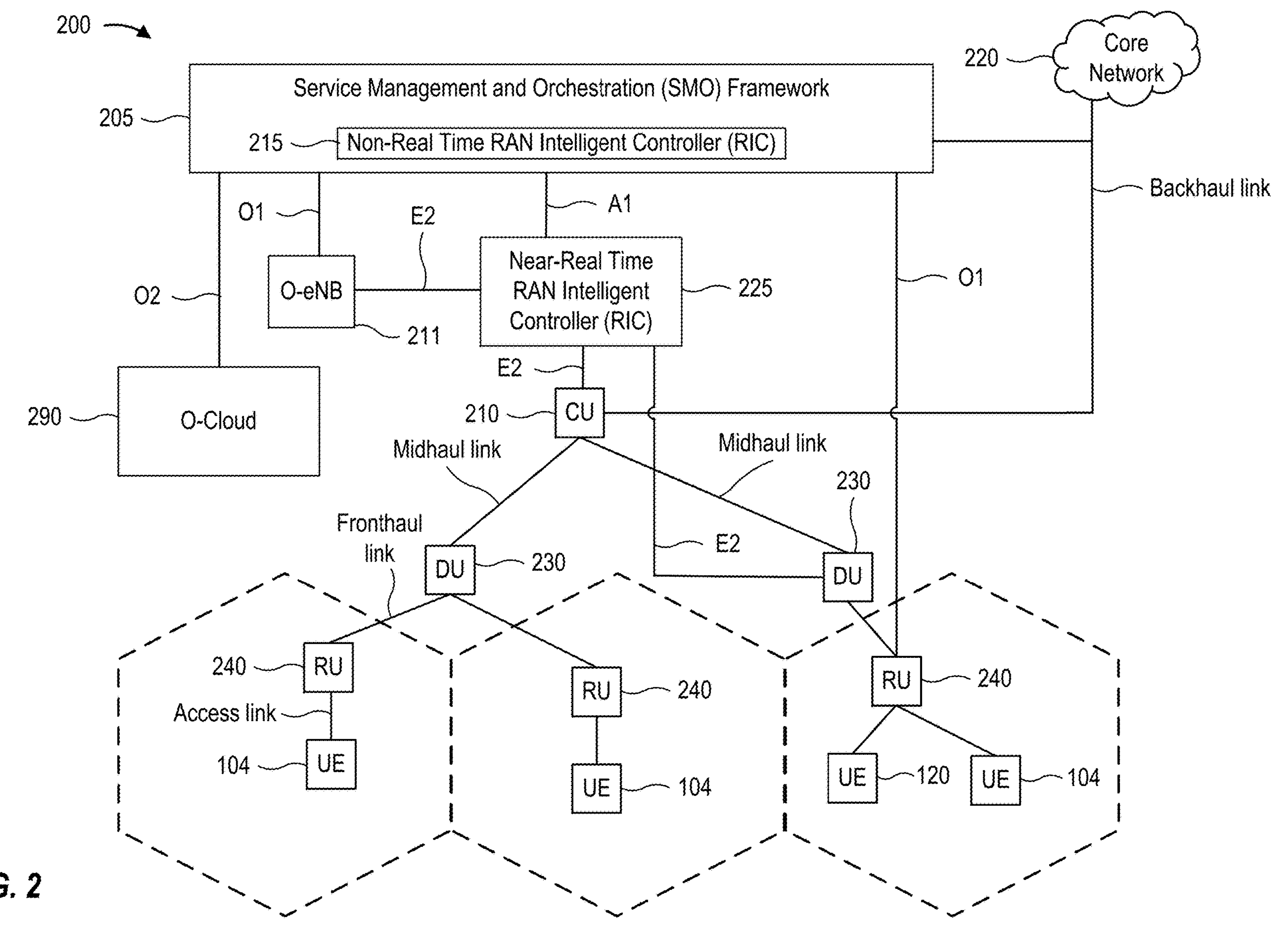
FIG. 2 depicts an example disaggregated base station architecture.

While BSs 102 are depicted in various aspects as unitary communications devices, BSs 102 may be implemented in various configurations. For example, one or more components of a base station may be disaggregated, including a central unit (CU), one or more distributed units (DUs), one or more radio units (RUS), a Near-Real Time (Near-RT) RAN Intelligent Controller (RIC), or a Non-Real Time (Non-RT) RIC, to name a few examples. In another example, various aspects of a base station may be virtualized. More generally, a base station (e.g., BS 102) may include components that are located at a single physical location or components located at various physical locations. In examples in which a base station includes components that are located at various physical locations, the various components may each perform functions such that, collectively, the various components achieve functionality that is similar to a base station that is located at a single physical location. In some aspects, a base station including components that are located at various physical locations may be referred to as a disaggregated radio access network architecture, such as an Open RAN (O-RAN) or Virtualized RAN (VRAN) architecture. FIG. 2 depicts and describes an example disaggregated base station architecture.

Different BSs 102 within wireless communications network 100 may also be configured to support different radio access technologies, such as 3G, 4G, and/or 5G. For example, BSs 102 configured for 4G LTE (collectively referred to as Evolved Universal Mobile Telecommunications System (UMTS) Terrestrial Radio Access Network (E-UTRAN)) may interface with the EPC 160 through first backhaul links 132 (e.g., an S1 interface). BSs 102 configured for 5G (e.g., 5G NR or Next Generation RAN (NG-RAN)) may interface with 5GC 190 through second backhaul links 184. BSs 102 may communicate directly or indirectly (e.g., through the EPC 160 or 5GC 190) with each other over third backhaul links 134 (e.g., $x_2$ interface), which may be wired or wireless.

Wireless communications network 100 may subdivide the electromagnetic spectrum into various classes, bands, channels, or other features. In some aspects, the subdivision is provided based on wavelength and frequency, where frequency may also be referred to as a carrier, a subcarrier, a frequency channel, a tone, or a subband. For example, 3GPP currently defines Frequency Range 1 (FR1) as including 410 MHz-7125 MHz, which is often referred to (interchangeably) as "Sub-6 GHz". Similarly, 3GPP currently defines Frequency Range 2 (FR2) as including 24,250 MHz-71,000 MHZ, which is sometimes referred to (interchangeably) as a "millimeter wave" ("mmW" or "mmWave"). In some cases, FR2 may be further defined in terms of sub-ranges, such as a first sub-range FR2-1 including 24,250 MHz-52,600 MHz and a second sub-range FR2-2 including 52,600 MHz-71,000 MHz. A base station configured to communicate using mm Wave/near mmWave radio frequency bands (e.g., a mmWave base station such as BS 180) may utilize beamforming (e.g., 182) with a UE (e.g., 104) to improve path loss and range.

The communications links 120 between BSs 102 and, for example, UEs 104, may be through one or more carriers, which may have different bandwidths (e.g., 5, 10, 15, 20, 100, 400, and/or other MHz), and which may be aggregated in various aspects. Carriers may or may not be adjacent to each other. Allocation of carriers may be asymmetric with respect to DL and UL (e.g., more or fewer carriers may be allocated for DL than for UL).

Communications using higher frequency bands may have higher path loss and a shorter range compared to lower frequency communications. Accordingly, certain base stations (e.g., 180 in FIG. 1) may utilize beamforming 182 with a UE 104 to improve path loss and range. For example, BS 180 and the UE 104 may each include a plurality of antennas, such as antenna elements, antenna panels, and/or antenna arrays to facilitate the beamforming. In some cases, BS 180 may transmit a beamformed signal to UE 104 in one or more transmit directions 182'. UE 104 may receive the beamformed signal from the BS 180 in one or more receive directions 182". UE 104 may also transmit a beamformed signal to the BS 180 in one or more transmit directions 182". BS 180 may also receive the beamformed signal from UE 104 in one or more receive directions 182'. BS 180 and UE 104 may then perform beam training to determine the best receive and transmit directions for each of BS 180 and UE 104. Notably, the transmit and receive directions for BS 180 may or may not be the same. Similarly, the transmit and receive directions for UE 104 may or may not be the same.

Wireless communications network 100 further includes a Wi-Fi AP 150 in communication with Wi-Fi stations (STAs) 152 via communications links 154 in, for example, a 2.4 GHz and/or 5 GHz unlicensed frequency spectrum.

Certain UEs 104 may communicate with each other using device-to-device (D2D) communications link 158. D2D communications link 158 may use one or more sidelink channels, such as a physical sidelink broadcast channel (PSBCH), a physical sidelink discovery channel (PSDCH), a physical sidelink shared channel (PSSCH), a physical sidelink control channel (PSCCH), and/or a physical sidelink feedback channel (PSFCH).

EPC 160 may include various functional components, including: a Mobility Management Entity (MME) 162, other MMEs 164, a Serving Gateway 166, a Multimedia Broadcast Multicast Service (MBMS) Gateway 168, a Broadcast Multicast Service Center (BM-SC) 170, and/or a Packet Data Network (PDN) Gateway 172, such as in the depicted example. MME 162 may be in communication with a Home Subscriber Server (HSS) 174. MME 162 is the control node that processes the signaling between the UEs 104 and the EPC 160. Generally, MME 162 provides bearer and connection management.

Generally, user Internet protocol (IP) packets are transferred through Serving Gateway 166, which itself is connected to PDN Gateway 172. PDN Gateway 172 provides UE IP address allocation as well as other functions. PDN Gateway 172 and the BM-SC 170 are connected to IP Services 176, which may include, for example, the Internet, an intranet, an IP Multimedia Subsystem (IMS), a Packet Switched (PS) streaming service, and/or other IP services.

BM-SC 170 may provide functions for MBMS user service provisioning and delivery. BM-SC 170 may serve as an entry point for content provider MBMS transmission, may be used to authorize and initiate MBMS Bearer Services within a public land mobile network (PLMN), and/or may be used to schedule MBMS transmissions. MBMS Gateway 168 may be used to distribute MBMS traffic to the BSs 102 belonging to a Multicast Broadcast Single Frequency Network (MBSFN) area broadcasting a particular service, and/or may be responsible for session management (start/stop) and for collecting eMBMS related charging information.

5GC 190 may include various functional components, including: an Access and Mobility Management Function (AMF) 192, other AMFs 193, a Session Management Function (SMF) 194, and a User Plane Function (UPF) 195. AMF 192 may be in communication with Unified Data Management (UDM) 196.

AMF 192 is a control node that processes signaling between UEs 104 and 5GC 190. AMF 192 provides, for example, quality of service (QOS) flow and session management.

Internet protocol (IP) packets are transferred through UPF 195, which is connected to the IP Services 197, and which provides UE IP address allocation as well as other functions for 5GC 190. IP Services 197 may include, for example, the Internet, an intranet, an IMS, a PS streaming service, and/or other IP services.

In various aspects, a network entity can be implemented as an aggregated base station, as a disaggregated base station, a component of a base station, an integrated access and backhaul (IAB) node, a relay node, a sidelink node, to name a few examples.

FIG. 2 depicts an example disaggregated base station 200 architecture. The disaggregated base station 200 architecture may include one or more central units (CUs) 210 that can communicate directly with a core network 220 via a backhaul link, or indirectly with the core network 220 through one or more disaggregated base station units (such as a Near-Real Time (Near-RT) RAN Intelligent Controller (RIC) 225 via an E2 link, or a Non-Real Time (Non-RT) RIC 215 associated with a Service Management and Orchestration (SMO) Framework 205, or both). A CU 210 may communicate with one or more distributed units (DUs) 230 via respective midhaul links, such as an F1 interface. The DUs 230 may communicate with one or more radio units (RUs) 240 via respective fronthaul links. The RUs 240 may communicate with respective UEs 104 via one or more radio frequency (RF) access links. In some implementations, the UE 104 may be simultaneously served by multiple RUs 240.

Each of the units, e.g., the CUs 210, the DUs 230, the RUs 240, as well as the Near-RT RICs 225, the Non-RT RICs 215 and the SMO Framework 205, may include one or more interfaces or be coupled to one or more interfaces configured to receive or transmit signals, data, or information (collectively, signals) via a wired or wireless transmission medium. Each of the units, or an associated processor or controller providing instructions to the communications interfaces of the units, can be configured to communicate with one or more of the other units via the transmission medium. For example, the units can include a wired interface configured to receive or transmit signals over a wired transmission medium to one or more of the other units. Additionally or alternatively, the units can include a wireless interface, which may include a receiver, a transmitter or transceiver (such as a radio frequency (RF) transceiver), configured to receive or transmit signals, or both, over a wireless transmission medium to one or more of the other units.

In some aspects, the CU 210 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 210. The CU 210 may be configured to handle user plane functionality (e.g., Central Unit-User Plane (CU-UP)), control plane functionality (e.g., Central Unit-Control Plane (CU-CP)), or a combination thereof. In some implementations, the CU 210 can be logically split into one or more CU-UP units and one or more CU-CP units. The CU-UP unit can communicate bidirectionally with the CU-CP unit via an interface, such as the E1 interface when implemented in an O-RAN configuration. The CU 210 can be implemented to communicate with the DU 230, as necessary, for network control and signaling.

The DU 230 may correspond to a logical unit that includes one or more base station functions to control the operation of one or more RUs 240. In some aspects, the DU 230 may host one or more of a radio link control (RLC) layer, a medium access control (MAC) layer, and one or more high physical (PHY) layers (such as modules for forward error correction (FEC) encoding and decoding, scrambling, modulation and demodulation, or the like) depending, at least in part, on a functional split, such as those defined by the 3$^{rd}$ Generation Partnership Project (3GPP). In some aspects, the DU 230 may further host one or more low PHY layers. Each layer (or module) can be implemented with an interface configured to communicate signals with other layers (and modules) hosted by the DU 230, or with the control functions hosted by the CU 210.

Lower-layer functionality can be implemented by one or more RUs 240. In some deployments, an RU 240, controlled by a DU 230, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 240 can be implemented to handle over the air (OTA) communications with one or more UEs 104. In some implementations, real-time and non-real-time aspects of control and user plane communications with the RU(s) 240 can be controlled by the corresponding DU 230. In some scenarios, this configuration can enable the DU(s) 230 and the CU 210 to be implemented in a cloud-based RAN architecture, such as a vRAN architecture.

The SMO Framework 205 may be configured to support RAN deployment and provisioning of non-virtualized and virtualized network elements. For non-virtualized network elements, the SMO Framework 205 may be configured to support the deployment of dedicated physical resources for RAN coverage requirements which may be managed via an operations and maintenance interface (such as an O1 interface). For virtualized network elements, the SMO Framework 205 may be configured to interact with a cloud computing platform (such as an open cloud (O-Cloud) 290) to perform network element life cycle management (such as to instantiate virtualized network elements) via a cloud computing platform interface (such as an 02 interface). Such virtualized network elements can include, but are not limited to, CUs 210, DUs 230, RUs 240 and Near-RT RICs 225. In some implementations, the SMO Framework 205 can communicate with a hardware aspect of a 4G RAN, such as an open eNB (O-eNB) 211, via an O1 interface. Additionally, in some implementations, the SMO Framework 205 can communicate directly with one or more RUs 240 via an O1 interface. The SMO Framework 205 also may include a Non-RT RIC 215 configured to support functionality of the SMO Framework 205.

The Non-RT RIC 215 may be configured to include a logical function that enables non-real-time control and optimization of RAN elements and resources, Artificial Intelligence/Machine Learning (AI/ML) workflows including model training and updates, or policy-based guidance of applications/features in the Near-RT RIC 225. The Non-RT RIC 215 may be coupled to or communicate with (such as via an A1 interface) the Near-RT RIC 225. The Near-RT RIC 225 may be configured to include a logical function that enables near-real-time control and optimization of RAN elements and resources via data collection and actions over an interface (such as via an E2 interface) connecting one or more CUs 210, one or more DUs 230, or both, as well as an O-eNB, with the Near-RT RIC 225.

In some implementations, to generate AI/ML models to be deployed in the Near-RT RIC 225, the Non-RT RIC 215 may receive parameters or external enrichment information from external servers. Such information may be utilized by the Near-RT RIC 225 and may be received at the SMO Framework 205 or the Non-RT RIC 215 from non-network data sources or from network functions. In some examples, the Non-RT RIC 215 or the Near-RT RIC 225 may be configured to tune RAN behavior or performance. For example, the Non-RT RIC 215 may monitor long-term trends and patterns for performance and employ AI/ML models to perform corrective actions through the SMO Framework 205 (such as reconfiguration via O1) or via creation of RAN management policies (such as A1 policies).

Figure 3:
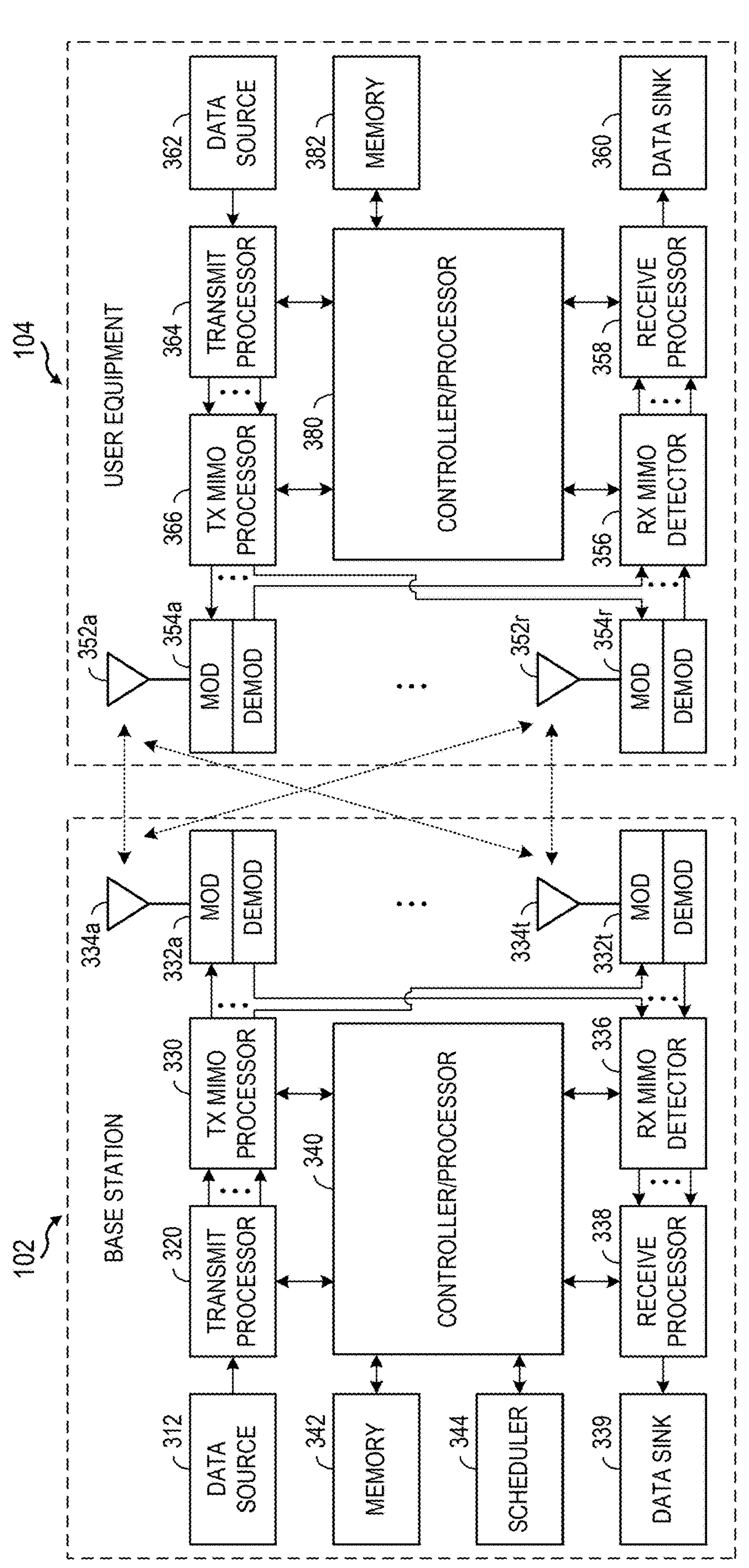
FIG. 3 depicts aspects of an example base station and an example user equipment.

FIG. 3 depicts aspects of an example BS 102 and a UE 104.

Generally, BS 102 includes various processors (e.g., 320, 330, 338, and 340), antennas 334*a-t* (collectively 334), transceivers 332*a-t* (collectively 332), which include modulators and demodulators, and other aspects, which enable wireless transmission of data (e.g., data source 312) and wireless reception of data (e.g., data sink 339). For example, BS 102 may send and receive data between BS 102 and UE 104. BS 102 includes controller/processor 340, which may be configured to implement various functions described herein related to wireless communications.

Generally, UE 104 includes various processors (e.g., 358, 364, 366, and 380), antennas 352*a-r* (collectively 352), transceivers 354*a-r* (collectively 354), which include modulators and demodulators, and other aspects, which enable wireless transmission of data (e.g., retrieved from data source 362) and wireless reception of data (e.g., provided to data sink 360). UE 104 includes controller/processor 380, which may be configured to implement various functions described herein related to wireless communications.

In regards to an example downlink transmission, BS 102 includes a transmit processor 320 that may receive data from a data source 312 and control information from a controller/processor 340. The control information may be for the physical broadcast channel (PBCH), physical control format indicator channel (PCFICH), physical HARQ indicator channel (PHICH), physical downlink control channel (PDCCH), group common PDCCH (GC PDCCH), and/or others. The data may be for the physical downlink shared channel (PDSCH), in some examples.

Transmit processor 320 may process (e.g., encode and symbol map) the data and control information to obtain data symbols and control symbols, respectively. Transmit processor 320 may also generate reference symbols, such as for the primary synchronization signal (PSS), secondary synchronization signal (SSS), PBCH demodulation reference signal (DMRS), and channel state information reference signal (CSI-RS).

Transmit (TX) multiple-input multiple-output (MIMO) processor 330 may perform spatial processing (e.g., precoding) on the data symbols, the control symbols, and/or the reference symbols, if applicable, and may provide output symbol streams to the modulators (MODs) in transceivers 332*a*-332*t*. Each modulator in transceivers 332*a*-332*t* may process a respective output symbol stream to obtain an output sample stream. Each modulator may further process (e.g., convert to analog, amplify, filter, and upconvert) the output sample stream to obtain a downlink signal. Downlink signals from the modulators in transceivers 332*a*-332*t* may be transmitted via the antennas 334*a*-334*t*, respectively.

In order to receive the downlink transmission, UE 104 includes antennas 352*a*-352*r* that may receive the downlink signals from the BS 102 and may provide received signals to the demodulators (DEMODs) in transceivers 354*a*-354*r*, respectively. Each demodulator in transceivers 354*a*-354*r* may condition (e.g., filter, amplify, downconvert, and digitize) a respective received signal to obtain input samples. Each demodulator may further process the input samples to obtain received symbols.

MIMO detector 356 may obtain received symbols from all the demodulators in transceivers 354*a*-354*r*, perform MIMO detection on the received symbols if applicable, and provide detected symbols. Receive processor 358 may process (e.g., demodulate, deinterleave, and decode) the detected symbols, provide decoded data for the UE 104 to a data sink 360, and provide decoded control information to a controller/processor 380.

In regards to an example uplink transmission, UE 104 further includes a transmit processor 364 that may receive and process data (e.g., for the PUSCH) from a data source 362 and control information (e.g., for the physical uplink control channel (PUCCH)) from the controller/processor 380. Transmit processor 364 may also generate reference symbols for a reference signal (e.g., for the sounding reference signal (SRS)). The symbols from the transmit processor 364 may be precoded by a TX MIMO processor 366 if applicable, further processed by the modulators in transceivers 354*a*-354*r* (e.g., for SC-FDM), and transmitted to BS 102.

At BS 102, the uplink signals from UE 104 may be received by antennas 334*a-t*, processed by the demodulators in transceivers 332*a*-332*t*, detected by a MIMO detector 336 if applicable, and further processed by a receive processor 338 to obtain decoded data and control information sent by UE 104. Receive processor 338 may provide the decoded data to a data sink 339 and the decoded control information to the controller/processor 340.

Memories 342 and 382 may store data and program codes for BS 102 and UE 104, respectively.

Scheduler 344 may schedule UEs for data transmission on the downlink and/or uplink.

In various aspects, BS 102 may be described as transmitting and receiving various types of data associated with the methods described herein. In these contexts, "transmitting" may refer to various mechanisms of outputting data, such as outputting data from data source 312, scheduler 344, memory 342, transmit processor 320, controller/processor

340, TX MIMO processor 330, transceivers 332*a-t*, antenna 334*a-t*, and/or other aspects described herein. Similarly, "receiving" may refer to various mechanisms of obtaining data, such as obtaining data from antennas 334*a-t*, transceivers 332*a-t*, RX MIMO detector 336, controller/processor 340, receive processor 338, scheduler 344, memory 342, and/or other aspects described herein.

In various aspects, UE 104 may likewise be described as transmitting and receiving various types of data associated with the methods described herein. In these contexts, "transmitting" may refer to various mechanisms of outputting data, such as outputting data from data source 362, memory 382, transmit processor 364, controller/processor 380, TX MIMO processor 366, transceivers 354*a-t*, antenna 352*a-t*, and/or other aspects described herein. Similarly, "receiving" may refer to various mechanisms of obtaining data, such as obtaining data from antennas 352*a-t*, transceivers 354*a-t*, RX MIMO detector 356, controller/processor 380, receive processor 358, memory 382, and/or other aspects described herein.

In some aspects, one or more processors may be configured to perform various operations, such as those associated with the methods described herein, and transmit (output) to or receive (obtain) data from another interface that is configured to transmit or receive, respectively, the data.

FIGS. 4A, 4B, 4C, and 4D depict aspects of data structures for a wireless communications network, such as wireless communications network 100 of FIG. 1.

Figures 4A, 4B, 4C, 4D:
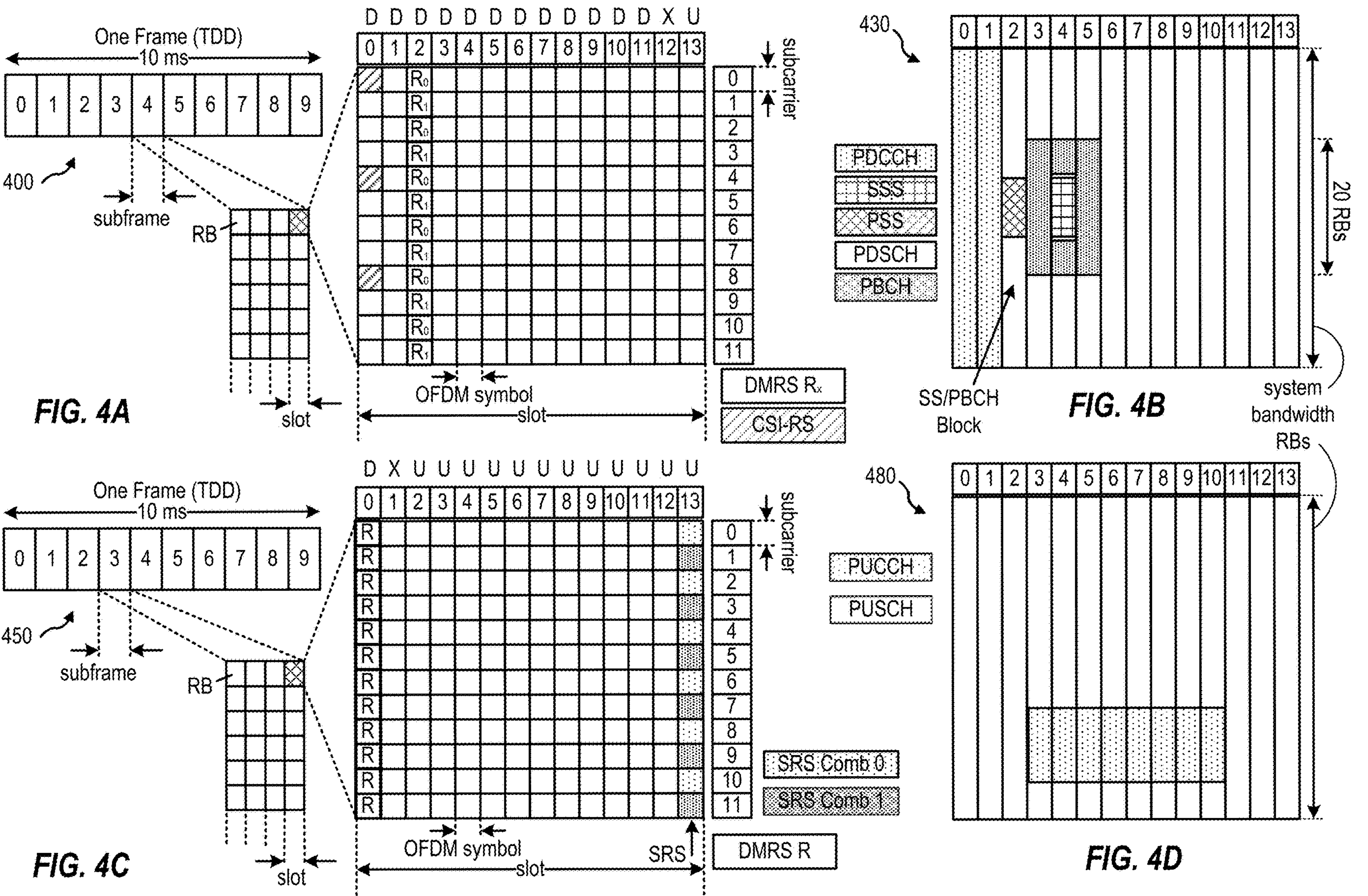
FIGS. 4A, 4B, 4C, and 4D depict various example aspects of data structures for a wireless communications network.

In particular, FIG. 4A is a diagram 400 illustrating an example of a first subframe within a 5G (e.g., 5G NR) frame structure, FIG. 4B is a diagram 430 illustrating an example of DL channels within a 5G subframe, FIG. 4C is a diagram 450 illustrating an example of a second subframe within a 5G frame structure, and FIG. 4D is a diagram 480 illustrating an example of UL channels within a 5G subframe.

Wireless communications systems may utilize orthogonal frequency division multiplexing (OFDM) with a cyclic prefix (CP) on the uplink and downlink. Such systems may also support half-duplex operation using time division duplexing (TDD). OFDM and single-carrier frequency division multiplexing (SC-FDM) partition the system bandwidth (e.g., as depicted in FIGS. 4B and 4D) into multiple orthogonal subcarriers. Each subcarrier may be modulated with data. Modulation symbols may be sent in the frequency domain with OFDM and/or in the time domain with SC-FDM.

A wireless communications frame structure may be frequency division duplex (FDD), in which, for a particular set of subcarriers, subframes within the set of subcarriers are dedicated for either DL or UL. Wireless communications frame structures may also be time division duplex (TDD), in which, for a particular set of subcarriers, subframes within the set of subcarriers are dedicated for both DL and UL.

In FIGS. 4A and 4C, the wireless communications frame structure is TDD where Dis DL, U is UL, and X is flexible for use between DL/UL. UEs may be configured with a slot format through a received slot format indicator (SFI) (dynamically through DL control information (DCI), or semi-statically/statically through radio resource control (RRC) signaling). In the depicted examples, a 10 ms frame is divided into 10 equally sized 1 ms subframes. Each subframe may include one or more time slots. In some examples, each slot may include 7 or 14 symbols, depending on the slot format.

Subframes may also include mini-slots, which generally have fewer symbols than an entire slot. Other wireless communications technologies may have a different frame structure and/or different channels.

In certain aspects, the number of slots within a subframe is based on a slot configuration and a numerology. For example, for slot configuration 0, different numerologies (μ) 0 to 6 allow for 1, 2, 4, 8, 16, 32, and 64 slots, respectively, per subframe. For slot configuration 1, different numerologies 0 to 2 allow for 2, 4, and 8 slots, respectively, per subframe. Accordingly, for slot configuration 0 and numerology μ, there are 14 symbols/slot and 2μ slots/subframe. The subcarrier spacing and symbol length/duration are a function of the numerology. The subcarrier spacing may be equal to 24×15 kHz, where u is the numerology 0 to 6. As such, the numerology μ=0 has a subcarrier spacing of 15 kHz and the numerology μ=6 has a subcarrier spacing of 960 kHz. The symbol length/duration is inversely related to the subcarrier spacing. FIGS. 4A, 4B, 4C, and 4D provide an example of slot configuration 0 with 14 symbols per slot and numerology μ=2 with 4 slots per subframe. The slot duration is 0.25 ms, the subcarrier spacing is 60 kHz, and the symbol duration is approximately 16.67 us.

As depicted in FIGS. 4A, 4B, 4C, and 4D, a resource grid may be used to represent the frame structure. Each time slot includes a resource block (RB) (also referred to as physical RBs (PRBs)) that extends, for example, 12 consecutive subcarriers. The resource grid is divided into multiple resource elements (REs). The number of bits carried by each RE depends on the modulation scheme.

As illustrated in FIG. 4A, some of the REs carry reference (pilot) signals (RS) for a UE (e.g., UE 104 of FIGS. 1 and 3). The RS may include demodulation RS (DMRS) and/or channel state information reference signals (CSI-RS) for channel estimation at the UE. The RS may also include beam measurement RS (BRS), beam refinement RS (BRRS), and/or phase tracking RS (PT-RS).

FIG. 4B illustrates an example of various DL channels within a subframe of a frame. The physical downlink control channel (PDCCH) carries DCI within one or more control channel elements (CCEs), each CCE including, for example, nine RE groups (REGs), each REG including, for example, four consecutive REs in an OFDM symbol.

A primary synchronization signal (PSS) may be within symbol 2 of particular subframes of a frame. The PSS is used by a UE (e.g., 104 of FIGS. 1 and 3) to determine subframe/symbol timing and a physical layer identity.

A secondary synchronization signal (SSS) may be within symbol 4 of particular subframes of a frame. The SSS is used by a UE to determine a physical layer cell identity group number and radio frame timing.

Based on the physical layer identity and the physical layer cell identity group number, the UE can determine a physical cell identifier (PCI). Based on the PCI, the UE can determine the locations of the aforementioned DMRS. The physical broadcast channel (PBCH), which carries a master information block (MIB), may be logically grouped with the PSS and SSS to form a synchronization signal (SS)/PBCH block. The MIB provides a number of RBs in the system bandwidth and a system frame number (SFN). The physical downlink shared channel (PDSCH) carries user data, broadcast system information not transmitted through the PBCH such as system information blocks (SIBs), and/or paging messages.

As illustrated in FIG. 4C, some of the REs carry DMRS (indicated as R for one particular configuration, but other DMRS configurations are possible) for channel estimation at the base station. The UE may transmit DMRS for the PUCCH and DMRS for the PUSCH. The PUSCH DMRS may be transmitted, for example, in the first one or two symbols of the PUSCH. The PUCCH DMRS may be transmitted in different configurations depending on whether short or long PUCCHs are transmitted and depending on the particular PUCCH format used. UE 104 may transmit sounding reference signals (SRS). The SRS may be transmitted, for example, in the last symbol of a subframe. The SRS may have a comb structure, and a UE may transmit SRS on one of the combs. The SRS may be used by a base station for channel quality estimation to enable frequency-dependent scheduling on the UL.

FIG. 4D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and HARQ ACK/NACK feedback. The PUSCH carries data, and may additionally be used to carry a buffer status report (BSR), a power headroom report (PHR), and/or UCI.

Introduction to Polar Codes

Polar codes are a relatively recent breakthrough in coding theory which have been proven to asymptotically (for code size N approaching infinity) achieve the Shannon capacity. Polar codes have many desirable properties such as deterministic construction (e.g., based on a fast Hadamard transform), very low and predictable error floors, and simple successive-cancellation (SC) based decoding. They are currently being considered as a candidate for error-correction in next-generation wireless systems such as NR.

Polar codes are linear block codes of length $N=2^n$ where their generator matrix is constructed using the $n^{th}$ Kronecker power of the matrix $$G=\begin{pmatrix}1&0\\1&1\end{pmatrix},$$

denoted by $G^n$. For example, Equation 1 shows the resulting generator matrix for n=3.

$$G^{\otimes 3}=\begin{bmatrix}1&0&0&0&0&0&0&0\\1&1&0&0&0&0&0&0\\1&0&1&0&0&0&0&0\\1&1&1&1&0&0&0&0\\1&0&0&0&1&0&0&0\\1&1&0&0&1&1&0&0\\1&0&1&0&1&0&1&0\\1&1&1&1&1&1&1&1\end{bmatrix} \quad (1)$$

According to certain aspects, a codeword may be generated (e.g., by encoder 706) by using the generator matrix to encode a number of input bits consisting of K information bits and N−K "frozen" bits which contain no information and are "frozen" to a known value, such as zero. For example, given a number of input bits $=(u_0, u_1, \ldots, u_{N-1})$, a resulting codeword vector $x=(x_0, x_1, \ldots, x_{N-1})$ may be generated by encoding the input bits using the generator matrix G. This resulting codeword may then be rate matched and transmitted by a base station over a wireless medium and received by a UE.

When the received vectors are decoded, for example by using a Successive Cancellation (SC) decoder (e.g., decoder 816), every estimated bit, $\hat{u}_i$, has a predetermined error probability given that bits $u_0^{i-1}$ were correctly decoded, that, for an extremely large codesize N, tends towards either 0 or 0.5. Moreover, the proportion of estimated bits with a low error probability tends towards the capacity of the underlying channel. Polar codes exploit this phenomenon, called channel polarization, by using the most reliable K bits to transmit information, while setting to a predetermined value (such as 0), also referred to as freezing, the remaining (N−K) bits, for example as explained below.

Polar codes transform the channel into N parallel "virtual" channels for the N information and frozen bits. If C is the capacity of the channel, then, for sufficiently large values of N, there are almost N*C channels which are extremely reliable and there are almost N(1−C) channels which are extremely unreliable. The basic polar coding scheme then involves freezing (i.e., setting to a known value, such as zero) the input bits in u corresponding to the unreliable channels, while placing information bits only in the bits of u corresponding to reliable channels. For short-to-medium N, this polarization may not be complete in the sense there could be several channels which are neither completely unreliable nor completely reliable (i.e., channels that are marginally reliable). Depending on the rate of transmission, bits corresponding to these marginally reliable channels may be either frozen or used for information bits.

FIG. 5 is a block diagram 500 illustrating processes related to polar encoding and rate matching, in accordance with some aspects of the present disclosure. As shown, the bit sequence input for a given code block for channel coding is denoted by $c_0, c_1, c_2, \ldots, c_{K-1}$, where K is the number of bits to encode. After encoding the bits are denoted by $d_0, d_1, d_2, \ldots, d_{N-1}$, where $N=2^n$ N>K, and the polar coding rate R=K/N.

FIG. 6 illustrates an example diagram 600 of polar encoding with $(N=2^m, K)$ where m=3, corresponding to a code:

$$c=u\begin{pmatrix}1&0\\1&1\end{pmatrix}^{\otimes m}.$$

Payload bits $u_i$ are either information (carry information payload) or are frozen $u_i=0$. As illustrated, in this example, matrix $$\begin{pmatrix}1&0\\1&1\end{pmatrix}^{\otimes m}$$

polarizes $2^m$ copies ($2^3=8$) of channel W into subchannels $W^{(i)}$ that are either almost noisy ($I(W^{(i)})\rightarrow 0$) and almost noiseless ($I(w^{(i)})\rightarrow 1$). In this manner, the set of information bits: $i_0, \ldots i_{K-1}$ correspond to the K largest capacities $I(W^{(i)})$.

Aspects Related to Soft Combining Based on Automorphisms of Polar Codes

Soft combining allows a receiver to combine multiple received signal instances. This combining may help improve signal quality and increase the chances of successful decoding, even when some of the received instances are corrupted during transmission. Soft combining relies on the payload of consecutive transmissions to be the same.

Certain types of transmissions may not be ideal candidates for soft combining, due to portions of the payload that change in consecutive transmissions. For example, as noted above, a physical broadcast channel (PBCH) in NR has a payload with a certain portion that changes across transmissions. While polar coding may be used for PBCH transmissions (e.g., with fixed parameters of N=512, K=56 including a 24-bit checksum), a system frame number (SFN) payload portion changes. For example, as illustrated in diagram 700 of FIG. 7, the SFN (currently a 10-bit value i), is consecutively increased by 1 (modulo 1024, such that SFN rolls over to 0 after incrementing from 1023).

Unfortunately, this changing nature of the SFN portion of PBCH payload creates a challenge to soft combining of several consecutive transmissions, as the UE may not know that starting value of SFN in the received PBCH sample sequence. As a result, the UE may need to guess the starting point (of SFN in the received samples) and perform several decoding attempts, which is inefficient and may lead to increased power consumption.

Aspects of the present disclosure, however, provide a coding scheme that helps enable soft combine of multiple payloads even when the payloads differ in a number of bits. For example, the coding scheme proposed herein may help enable soft combining of multiple PBCH payloads, when a channel code is fixed and the payloads differ in a relatively small number of bits (e.g., SFN/counter bits).

Particular aspects of the subject matter described in this disclosure can be implemented to realize one or more of the following potential advantages. In some examples, the coding scheme proposed herein may allow for soft combining of PBCH transmissions sent with polar coding. As a result, the coding scheme proposed herein may help increase the chances of successful decoding, while limiting blind decoding and the corresponding increase in processing overhead and power consumption.

It will be appreciated that while examples of the present disclosure illustrate PBCH soft-combining, the coding schemes proposed herein may be used in a variety of communication scenarios to enable the soft-combining of different types of transmissions (e.g., that have a relatively large portion of common payload and a relatively small portion that changes).

The coding schemes proposed herein may utilize polar codes with a large automorphism group. In this context, an automorphism generally refers an isomorphism from an object to itself. Automorphism generally maintains a symmetry of an object and provides a way of mapping an object to itself, while preserving all of its structure. The set of all automorphisms of an object forms a group, referred to as the automorphism group.

As will be described in greater detail below, information bit locations may be selected in a manner such that automorphism group constraints are satisfied. PBCH (or other) payloads with different counter values may be obtained by consecutively applying a specific function (permutation plus scrambling). On the decoding side (at a receiver, such as a UE), a de-permutation step may be added in a list decoder before performing a checksum (e.g., cyclic redundancy check-CRC) check.

Figure 8:
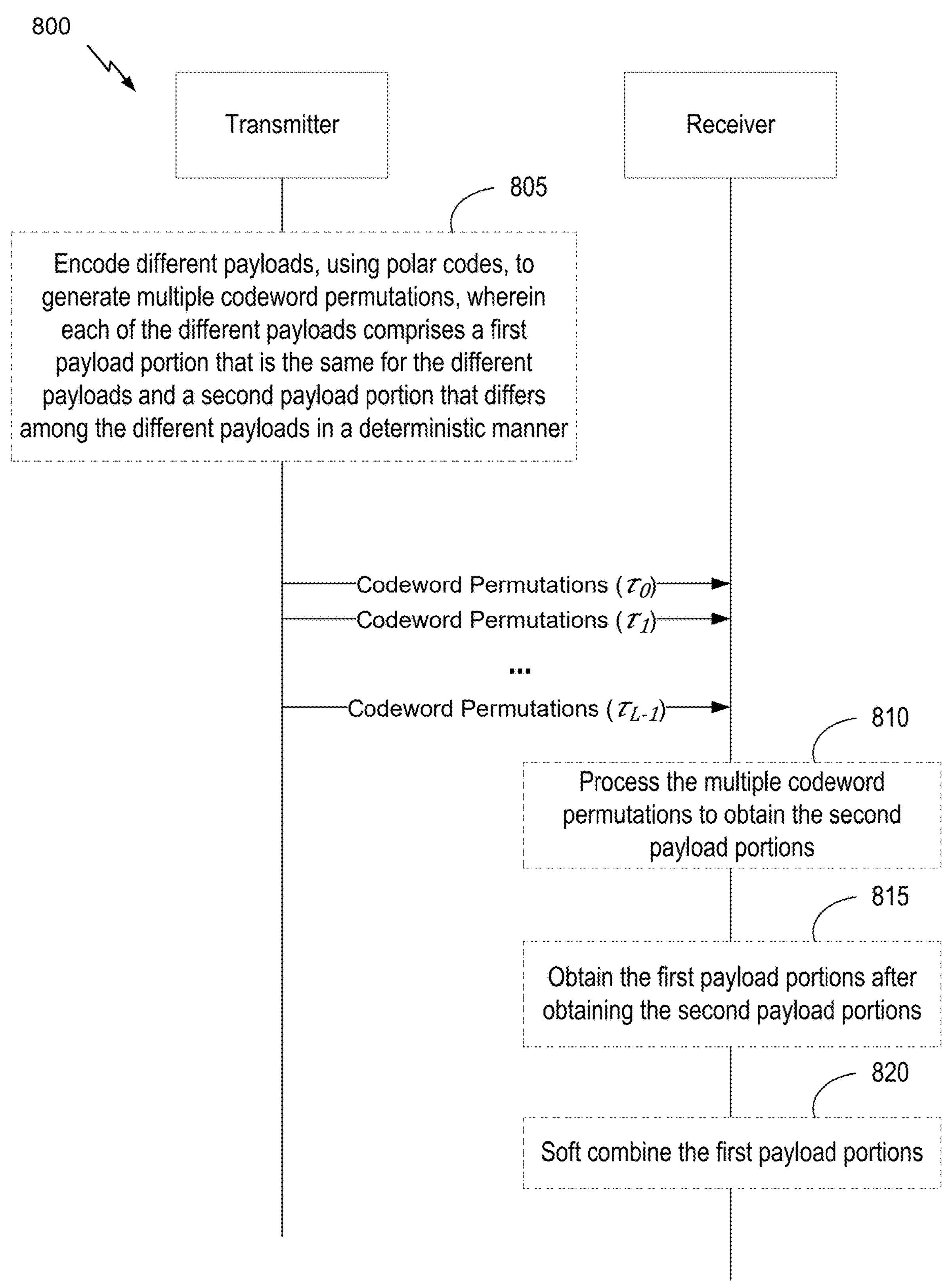
FIG. 8 depicts a call flow diagram for polar coding with soft combining, in accordance with aspects of the present disclosure.

Automorphism-based soft combining proposed herein may be understood with reference to the call flow diagram 800 of FIG. 8. In some aspects, transmitter shown in FIG. 8 may be a network entity, such as the BS depicted and described with respect to FIGS. 1 and 3 or a disaggregated base station depicted and described with respect to FIG. 2. Similarly, the receiver shown in FIG. 8 may be an example of UE 104 depicted and described with respect to FIGS. 1 and 3. However, in other aspects, the transmitter and/or receiver may be some other type of wireless communications device.

As illustrated at 805, the transmitter may encode different payloads, using polar codes, to generate multiple codeword permutations. Each of the different payloads may comprise a first payload portion that is the same for the different payloads and a second payload portion that differs among the different payloads in a deterministic manner and each codeword permutation corresponds to one of the second payload portions.

For example, the different payloads may be different versions of a PBCH, with the first payload portion being a common PBCH payload (unchanged across transmissions) and the second payload portion may be the SFN payload (that increments by 1). As illustrated, the transmitter may then output the multiple codeword permutations sequentially.

As illustrated at 810, the receiver may process the multiple codeword permutations to obtain the second payload portions. At 815, the receiver obtains the first payload portions, after obtaining the second payload portions. At 820, the receiver performs soft combining of the first payload portions.

Continuing with the PBCH example, the receiver may process the multiple codeword permutations to extract different counter (SFN) values, obtain the remaining (non-changing) payload portions (e.g., by applying inverse transforms/de-permutating), and perform soft combining on these portions.

For standard polar encoding: $uA_m=c$. For a permutation matrix $P_x$:

$$cP_x = uA_mP_x = uT_uA_m \Rightarrow T_u = A_mP_xA_m \ \left(\text{since } A_m^{-1} = A_m\right),$$

thus applying $P_x$ corresponds to the linear transformation $T_u$ of the payload. The transmitter generally generates the t-th payload as $$cP_x^t,$$

for example, by applying $P_x$ to the (t−1)-th payload. Thus, the receiver may perform soft combining of $$cP_x^i,\ cP_x^{i+1},\ \ldots$$

by applying $$P_x^{(-t)}$$

to $$cP_x^{(i+t)}$$

for t=1, 2, . . . . According to the coding schemes proposed herein, counter (e.g., SFN) bits may be treated as frozen on the transmitter side and as information on the receiver. In other words, the transmitter assumes these bits are zero for transmission purposes and, instead, ensures that codeword permutations selected correspond to different counter values, while the receiver does not know the counter values ahead of time.

In general, an objective of the coding scheme proposed herein may be to find $P_x$ with large order, $$ord(P_x) = \min_{t>1,(P_x)^t=P_x} t.$$

In some cases, affine permutations may be considered:

$$x \to Ax + b$$

where x is a binary representation of codeword index. The coding scheme proposed herein may use polar codes that differ from typical (vanilla) polar codes that have only lower-triangular A, max period is 16 for N=512, which may too small for some use cases.

The coding schemes proposed herein may go beyond such typical polar codes, in order to get more permutations. For example, the coding schemes proposed herein may utilize a block low-triangular matrix $$A = \begin{pmatrix} A' & 0 \\ * & A'' \end{pmatrix} 900,$$

illustrated in FIG. 9A, where A', A" can be either low-triangular (LT) or anti-diagonal upper-triangular (ADT) (anti-diagonal plus nonzero above anti-diagonal). Restrictions placed on the frozen bit locations may help achieve a sequence change from typical vanilla polar codes.

FIGS. 9B and 9C illustrate two scenarios with matrices 910 and 920, formed with matrices 912 and 914, in different locations, as A' and A". In the first scenario, top-left to bottom-right matrix 912 is used for A' while top-right to bottom left matrix 914 is used for A". In the second scenario, top-right to bottom left matrix 914 is used for A' while top-left to bottom-right matrix 912 is used for A".

In the first scenario shown in FIG. 9B, A'∈LT(m'), A"∈ADT(m−m') which may result in better permutation decoding performance. In this scenario, symmetry in inner codes may result in many permutations that result in good decoding performance. A receiver can perform the decoding iteratively by consecutively running successive cancelation/successive cancelation list (SC/SCL) decoders on different 'good' permutations.

In the second scenario shown in FIG. 9C, A'∈UT(m'−m) where UT stands for upper triangle, A"∈ADT(m'), which may result in relatively good list decoding performance. In this scenario, symmetry in outer codes may be less suited for permutation decoding (than the first scenario), but may result in smaller SC/SCL performance loss relative to vanilla polar codes.

For both scenarios shown in FIGS. 9B and 9C, a maximal $P_x$ order may be expressed as $2^{\lceil \log_2 (m'+1) \rceil} \cdot (2^{m-m'}-1)$. In this case, the order may not be the power of 2–redundancy in counter values, as some are invalid, which could result in additional error control during the list decoding process.

Figure 10:
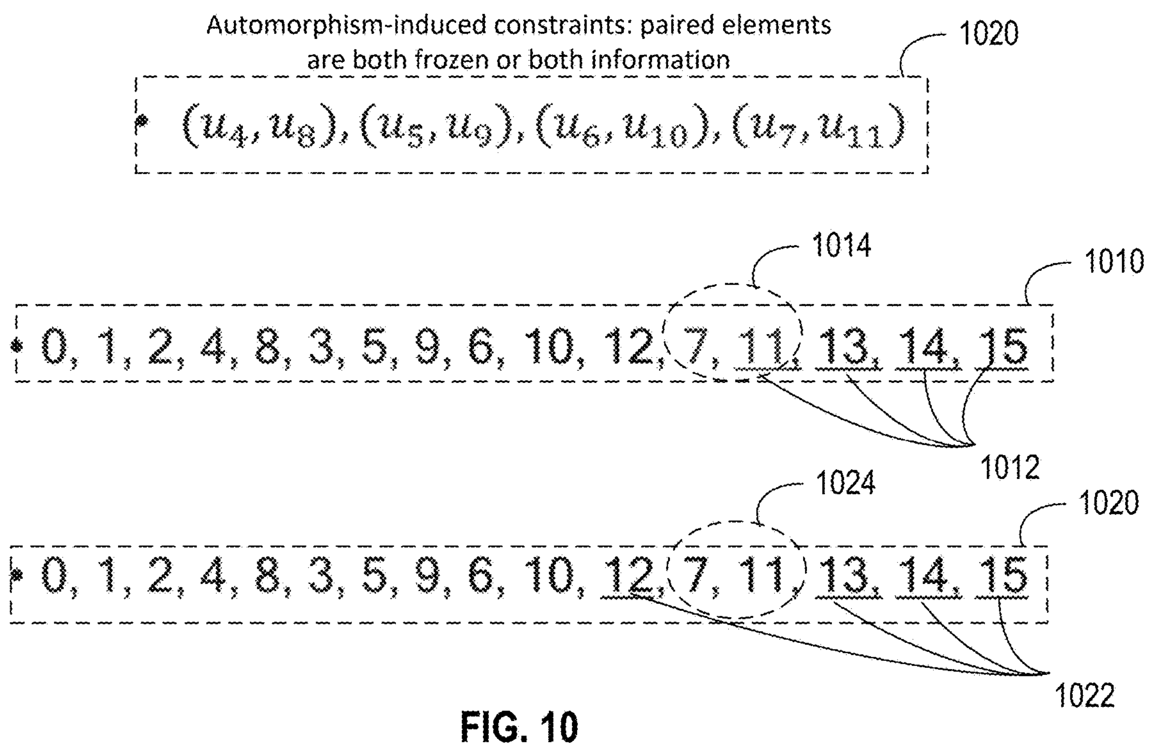
FIG. 10 depicts an example of information bit location constraints, in accordance with aspects of the present disclosure.

Constraints on the selection of information bit locations may be understood with reference to the example shown in FIG. 10. The example assumes parameters N=16, K=4 and matrix A 1000 and Px 1010 are:

$$A = \begin{pmatrix} 1 & 0 & 0 & 0 \\ 0 & 1 & 0 & 0 \\ 0 & 0 & 0 & 1 \\ 0 & 0 & 1 & 0 \end{pmatrix}, b = (0\ 0\ 0\ 0);$$

$$P_x = (0), 1, 2, 3, 8, 9, 10, 11, 4, 5, 6, 7, 12, 13, 14, 15); \text{and}$$

$$T_u: u_4 \leftrightarrow u_8, u_5 \leftrightarrow u_9, u_6 \leftrightarrow u_{10}, u_7 \leftrightarrow u_{11}.$$

Automorphism-induced constraints 1020 may dictate that pairs of element:

$$(u_4, u_8), (u_5, u_9), (u_6, u_{10}), (u_7, u_{11});$$

are either both frozen or both information. Thus, the following NR reliability sequence 1030, with underlining indicating information bits as shown at 1012:

0, 1, 2, 4, 8, 3, 5, 9, 6, 10, 12, 7, 11, 13, 14, 15;

violates the constraints, because bit $u_7$ is frozen but bit $u_{11}$ is information as indicated at 1014. On the other hand, if bit $u_{12}$ were made an information bit (instead of bit $u_{11}$), as in sequence 1040:

0, 1, 2, 4, 8, 3, 5, 9, 6, 10, 12, 7, 11, 13, 14, 15;

the information bits 1022 satisfy the above listed constraints (as $u_7$ and $u_{11}$ are both frozen as shown at 1024).

In some cases, the coding schemes proposed herein may be designed to address an all-zero payload case, that would otherwise result in no new permutation codeword, since applying $P_x$ corresponds to the linear transformation $T_u$ of the payload. In other words, if $T_u$ is a linear operation, the typical coding scheme would not result in new permutations when starting with an all-zero payload.

To address this issue, in some cases, a non-linear operation may be utilized on certain bits. For example, in some cases, a bit index u may be selected and a (relatively simple) nonlinear operation, such as:

$$u_\mu \to u_\mu + 1,$$

may be applied in the bit (u-domain) before applying the transform $T_u$. In effect, this may translate into a scrambling in the codeword domain:

$$c \to c + g_\mu,$$

where in codeword domain ($g_\mu$ is a row of Arikan matrix that corresponds to $u_\mu$). In some cases, bit $u_\mu$ may be part of the counter bits, such that there is not a need for additional bits. Similarly to other counter bits, $u_\mu$ may be treated as a frozen bit on the transmitter side, and as an information bit on the receiver.

Application of such a non-linear operation may be understood with reference to the example shown in FIG. 11. The example assumes N=4, that counter bits are $u_1$ and $u_2$, and that payload bit $u_3$ is zero. The example also assumes that Tu swaps $u_1$ and $u_2$ and that the bit index $\mu=2$ (such that this bit value is essentially flipped before swapping the bits).

As illustrated, for the first payload, all $u_i$ are zero (0 0 0 0), such that an all-zero codeword is transmitted:

$$c^{(0)} = (0\,0\,0\,0)\begin{pmatrix} 1 & 0 & 0 & 0 \\ 1 & 1 & 0 & 0 \\ 1 & 0 & 1 & 0 \\ 1 & 1 & 1 & 1 \end{pmatrix}.$$

As illustrated at 1110, for the second payload, the non-linear operation is applied ($u_2 \to u_2+1$), resulting in $u_1=0$, and $u_2=1$. Swapping $u_1$ and $u_2$, the following codeword is transmitted:

$$c^{(1)} = (0\,1\,0\,0)\begin{pmatrix} 1 & 0 & 0 & 0 \\ 1 & 1 & 0 & 0 \\ 1 & 0 & 1 & 0 \\ 1 & 1 & 1 & 1 \end{pmatrix}.$$

As illustrated at 1120, for the third payload applying $u_2 \to u_2+1$ results in $u_1=u_2=1$. After swapping $u_1$ and $u_2$, the following codeword is transmitted:

$$c^{(2)} = (0\,1\,1\,0)\begin{pmatrix} 1 & 0 & 0 & 0 \\ 1 & 1 & 0 & 0 \\ 1 & 0 & 1 & 0 \\ 1 & 1 & 1 & 1 \end{pmatrix}.$$

As illustrated at 1130, for the fourth payload applying $u_2 \to u_2+1$ results in $u_1=1$, $u_2=0$. After swapping $u_1$ and $u_2$, the following codeword is transmitted:

$$c^{(3)} = (0\,0\,1\,0)\begin{pmatrix} 1 & 0 & 0 & 0 \\ 1 & 1 & 0 & 0 \\ 1 & 0 & 1 & 0 \\ 1 & 1 & 1 & 1 \end{pmatrix}.$$

In this manner, all counter values (00, 01, 02, and 03) are successfully traversed due to the non-linear operation.

In general, the operation $\mu$: $u_2 \to u_2+1$ in codeword domain translates to:

$$c = (c_0, c_1, c_2, c_3) \to c \oplus (1, 0, 1, 0) = ((c_0+1), c_1, (c_2+1), c_3).$$

Operation $T_u$ in the codeword domain is $(c_0, c_1, c_2, c_3) \to (c_0, c_2, c_1, c_3)$. Thus, overall composition $T_u \cdot \mu$ is:

$$(c_0, c_1, c_2, c_3) \to ((c_0+1), (c_2+1), c_1, c_3).$$

Figures 12A, 12B:
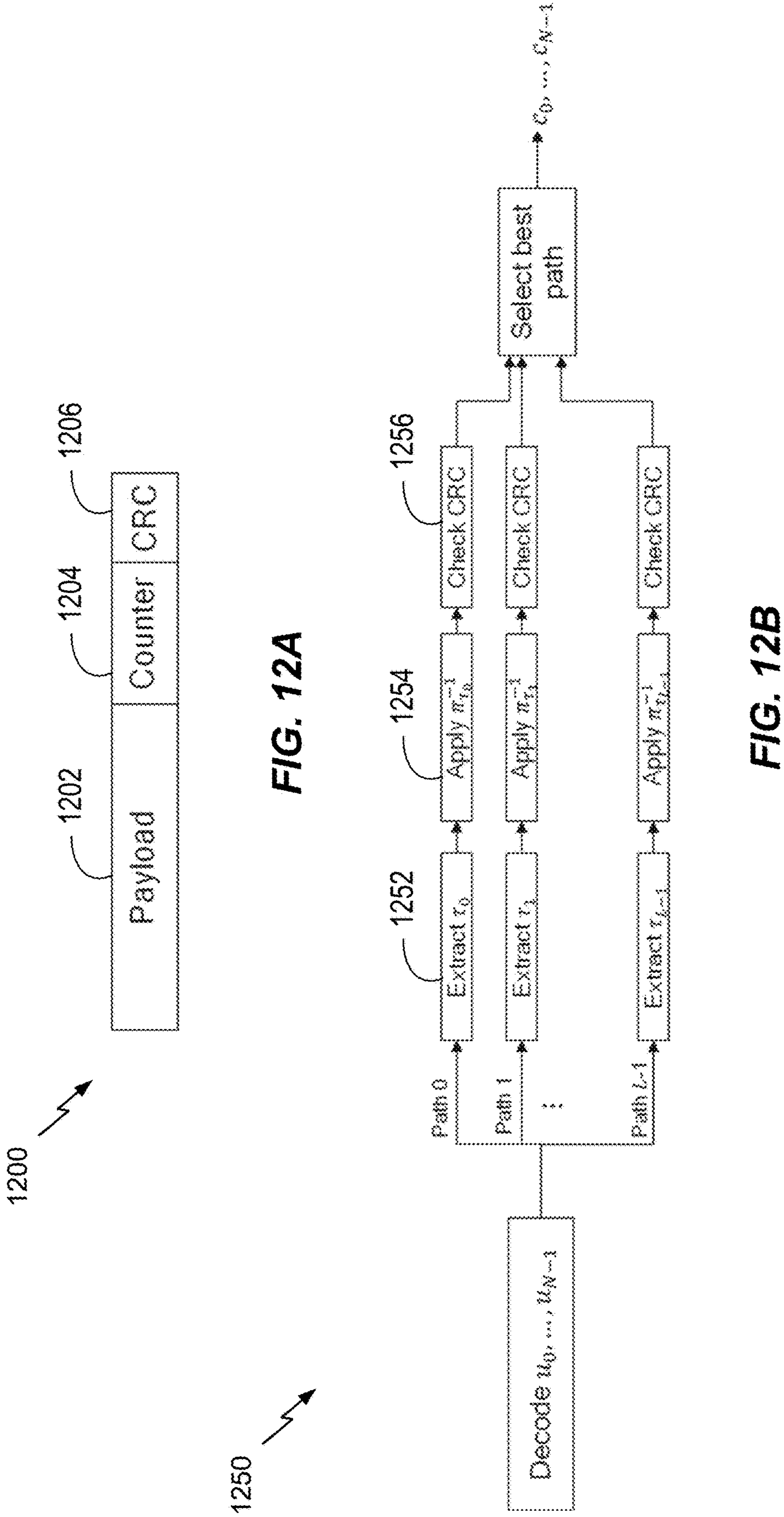
FIG. 12A depicts an example physical broadcast channel (PBCH) structure.
FIG. 12B depicts an example decoding processing chain, in accordance with aspects of the present disclosure.

Aspects of the present disclosure may also ensure that the coding schemes proposed herein accommodate checksums, such as cyclic redundancy check (CRC) values. As illustrated in FIG. 12A, in a PBCH structure 1200, a CRC 1206 is typically used to protect both the payload bits 1202 and counter bits 1204.

As described herein, each counter value t generally corresponds to a (different) codeword permutation $\pi_\tau = P_x^{\,i}$ for some SFN index i. One potential challenge is that, for i>0, a CRC may become invalid and a list decoder may not be able to find a correct path.

Aspects of the present disclosure, however, may accommodate CRCs, via a modification of the decoder flow (at the receiver side) as shown in the example 1250 of FIG. 12B. As shown at 1252, after processing a codeword permutation, the receiver may be able to extract counter bits (e.g., the counter value t associated with the codeword permutation).

After recovering the counter bits, the receiver knows the SFN index offset i. Thus, as shown at 1254, the receiver can apply an inverse transform (depermute matrix) $P_x^{-i}$, before checking the CRC (at 1256). This may essentially be implemented by mapping the decoded counter to a permutation index (corresponding to the permutation matrix applied at the transmitter side) and depermuting the codeword accordingly, before CRC checks for the list entries.

Example Operations

Figure 13:
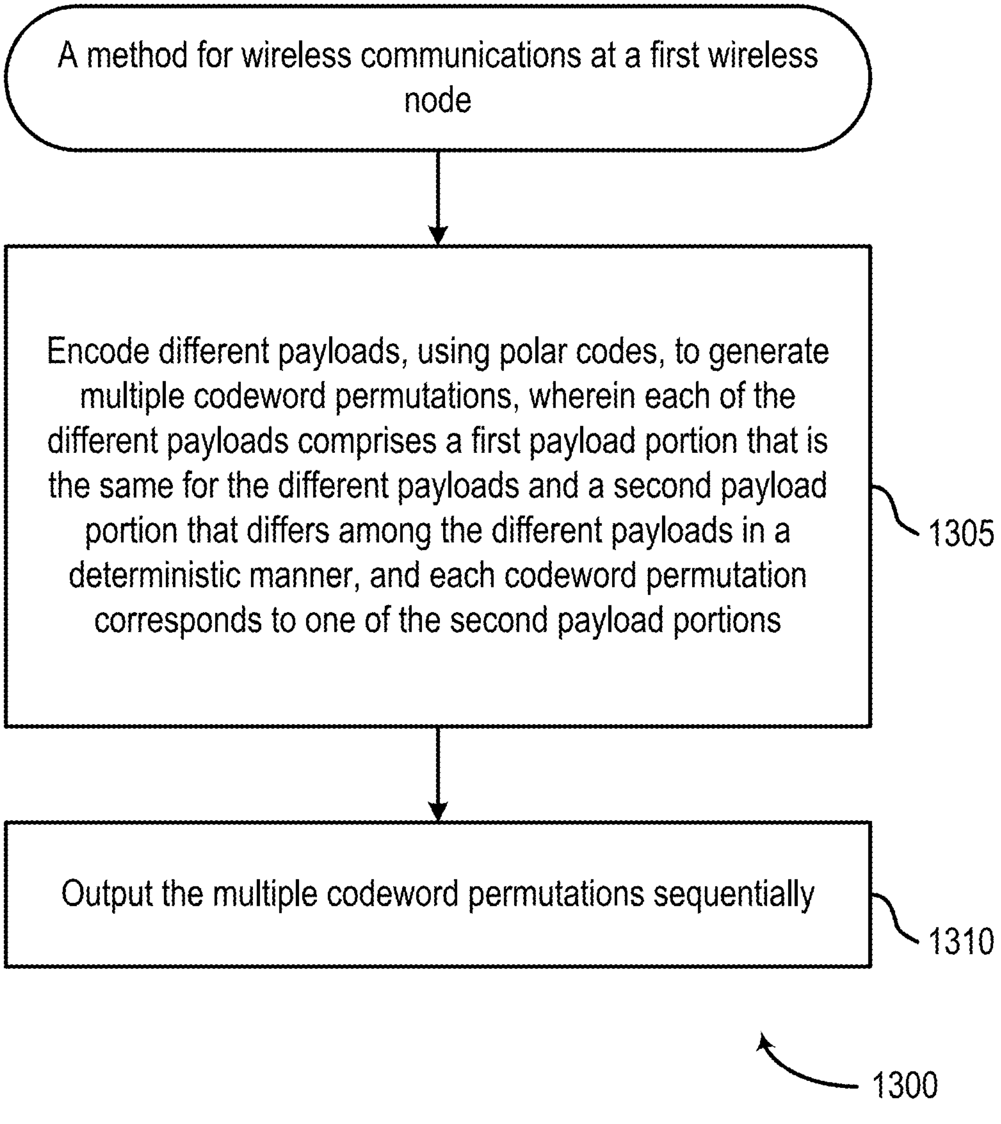
FIG. 13 depicts a method for wireless communications.

FIG. 13 shows an example of a method 1300 of wireless communications at a first wireless node, which functions as a transmitter in this case (e.g., with reference to the discussions in the context of FIG. 8). In some examples, the first wireless node is a user equipment, such as a UE 104 of FIGS. 1 and 3. In some examples, the first wireless node is a network entity, such as a BS 102 of FIGS. 1 and 3, or a disaggregated base station as discussed with respect to FIG. 2.

Method 1300 begins at step 1305 with encoding different payloads, using polar codes, to generate multiple codeword permutations, wherein each of the different payloads comprises a first payload portion that is the same for the different payloads and a second payload portion that differs among the different payloads in a deterministic manner, and each codeword permutation corresponds to one of the second payload portions. In some cases, the operations of this step refer to, or may be performed by, circuitry for encoding and/or code for encoding as described with reference to FIG. 15.

Method 1300 then proceeds to step 1310 with outputting the multiple codeword permutations sequentially. In some cases, the operations of this step refer to, or may be performed by, circuitry for outputting and/or code for outputting as described with reference to FIG. 15.

In some aspects, the different payloads correspond to physical broadcast channel (PBCH) transmissions; and the second payload portions correspond to system frame number (SFN) values conveyed in the PBCH transmissions.

In some aspects, the second payload portions correspond to counter values that change in a deterministic manner in different payloads.

In some aspects, the outputting comprises outputting a first codeword permutation corresponding to a first counter value and, subsequently, outputting a second codeword permutation corresponding to a second counter value; and the second codeword permutation is generated by applying a permutation matrix to the first codeword permutation.

In some aspects, the permutation matrix is associated with a matrix formed by a first matrix that has low-triangular (LT) properties and a second matrix that has anti-diagonal upper-triangular (ADT) properties.

In some aspects, each codeword permutation comprises one or more information bits and one or more frozen bits; and counter bits are treated as frozen bits when generating the first and second codeword permutations.

In some aspects, the multiple codeword permutations are generated using a permutation matrix; and the permutation matrix is associated with one or more restrictions on one or more locations of the one or more frozen bits, the one or more information bits or the one or more frozen bits and the one or more information bits.

In some aspects, the one or more restrictions include a restriction that at least one pair of bit locations used for frozen bits or used for the information bits.

In some aspects, the generating comprises performing a non-linear operation on at least one bit location prior to applying the permutation matrix.

In some aspects, the non-linear operation involves at least one counter bit.

Figure 15:
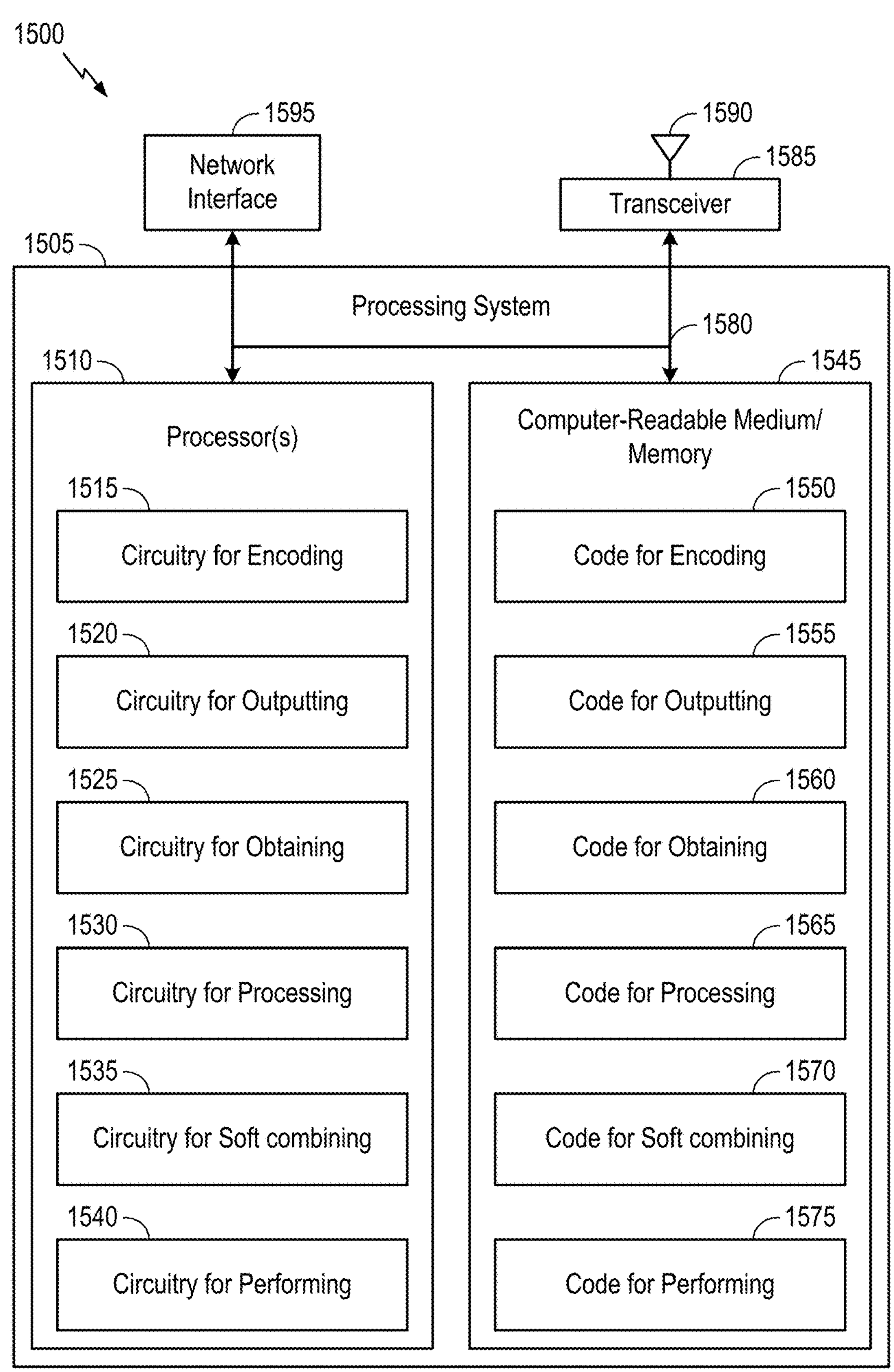
FIG. 15 depicts aspects of an example communications device.

In one aspect, method 1300, or any aspect related to it, may be performed by an apparatus, such as communications device 1500 of FIG. 15, which includes various components operable, configured, or adapted to perform the method 1300. Communications device 1500 is described below in further detail.

Note that FIG. 13 is just one example of a method, and other methods including fewer, additional, or alternative steps are possible consistent with this disclosure.

Figure 14:
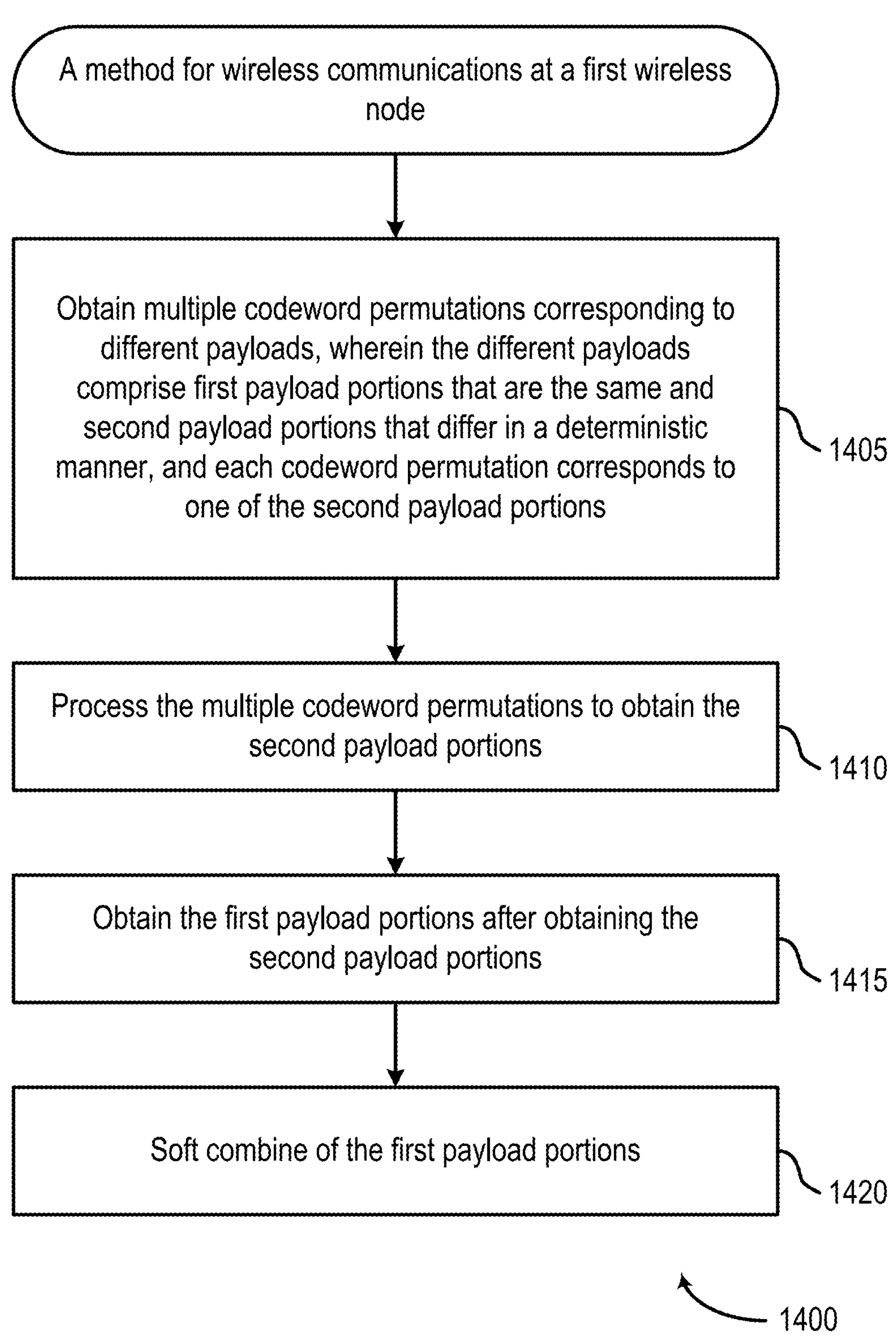
FIG. 14 depicts a method for wireless communications.

FIG. 14 shows an example of a method 1400 of wireless communications at a first wireless node, which functions as a receiver in this case (with reference to the discussions in the context of FIG. 8). In some examples, the first wireless node is a user equipment, such as a UE 104 of FIGS. 1 and 3. In some examples, the first wireless node is a network entity, such as a BS 102 of FIGS. 1 and 3, or a disaggregated base station as discussed with respect to FIG. 2.

Method 1400 begins at step 1405 with obtaining multiple codeword permutations corresponding to different payloads, wherein the different payloads comprise first payload portions that are the same and second payload portions that differ in a deterministic manner, and each codeword permutation corresponds to one of the second payload portions. In some cases, the operations of this step refer to, or may be performed by, circuitry for obtaining and/or code for obtaining as described with reference to FIG. 15. The multiple codeword permutations obtained at step 1405 in this case may correspond to those multiple codeword permutations outputted sequentially (by the transmitter) at step 1310 of the method 1300 depicted in FIG. 13.

Method 1400 then proceeds to step 1410 with processing the multiple codeword permutations to obtain the second payload portions. In some cases, the operations of this step refer to, or may be performed by, circuitry for processing and/or code for processing as described with reference to FIG. 15.

Method 1400 then proceeds to step 1415 with obtaining the first payload portions after obtaining the second payload portions. In some cases, the operations of this step refer to, or may be performed by, circuitry for obtaining and/or code for obtaining as described with reference to FIG. 15.

Method 1400 then proceeds to step 1420 with soft combining of the first payload portions. In some cases, the operations of this step refer to, or may be performed by, circuitry for soft combining and/or code for soft combining as described with reference to FIG. 15.

In some aspects, the different payloads correspond to physical broadcast channel (PBCH) transmissions; and the second payload portions correspond to system frame number (SFN) values conveyed in the PBCH transmissions.

In some aspects, the second payload portions correspond to counter values that change in a deterministic manner in different payloads.

In some aspects, each codeword permutation comprises one or more information bits and one or more frozen bits; and counter bits are treated as information bits when processing the multiple codeword permutations.

In some aspects, obtaining the first payload portions comprises: identifying an inverse transform associated with one of the second payload portions; and applying the inverse transform.

In some aspects, the inverse transform is associated with a matrix formed by a first matrix that has low-triangular (LT) properties and a second matrix that has anti-diagonal upper-triangular (ADT) properties.

In some aspects, the method 1400 further includes performing an error check operation after applying the inverse transform. In some cases, the operations of this step refer to, or may be performed by, circuitry for performing and/or code for performing as described with reference to FIG. 15.

In some aspects, the identification of the inverse transform associated with one of the second payload portions comprises mapping decoded bits of a second payload to a permutation index.

In some aspects, the application of the inverse transform results in a depermutation of a codeword permutation.

In some aspects, the processing of the multiple codeword permutations to obtain the second payload portions involves a non-linear operation.

In some aspects, the second payload portions correspond to counter values that change in a deterministic manner in different payloads; and the non-linear operation involves at least one counter value bit.

In one aspect, method 1400, or any aspect related to it, may be performed by an apparatus, such as communications device 1500 of FIG. 15, which includes various components operable, configured, or adapted to perform the method 1400. Communications device 1500 is described below in further detail.

Note that FIG. 14 is just one example of a method, and other methods including fewer, additional, or alternative steps are possible consistent with this disclosure.

Example Communications Device(s)

FIG. 15 depicts aspects of an example communications device 1500. In some aspects, communications device 1500 is a user equipment, such as UE 104 described above with respect to FIGS. 1 and 3. In some aspects, communications device 1500 is a network entity, such as BS 102 of FIGS. 1 and 3, or a disaggregated base station as discussed with respect to FIG. 2.

The communications device 1500 includes a processing system 1505 coupled to the transceiver 1585 (e.g., a transmitter and/or a receiver). In some aspects (e.g., when communications device 1500 is a network entity), processing system 1505 may be coupled to a network interface 1595 that is configured to obtain and send signals for the communications device 1500 via communication link(s), such as a backhaul link, midhaul link, and/or fronthaul link as described herein, such as with respect to FIG. 2. The transceiver 1585 is configured to transmit and receive signals for the communications device 1500 via the antenna 1590, such as the various signals as described herein. The processing system 1505 may be configured to perform processing functions for the communications device 1500, including processing signals received and/or to be transmitted by the communications device 1500.

The processing system 1505 includes one or more processors 1510. In various aspects, the one or more processors 1510 may be representative of one or more of receive processor 358, transmit processor 364, TX MIMO processor 366, and/or controller/processor 380, as described with respect to FIG. 3. In various aspects, one or more processors 1510 may be representative of one or more of receive processor 338, transmit processor 320, TX MIMO processor 330, and/or controller/processor 340, as described with respect to FIG. 3. The one or more processors 1510 are coupled to a computer-readable medium/memory 1545 via a bus 1580. In certain aspects, the computer-readable medium/memory 1545 is configured to store instructions (e.g., computer-executable code) that when executed by the one or more processors 1510, cause the one or more processors 1510 to perform the method 1300 described with respect to FIG. 13, or any aspect related to it; and the method 1400 described with respect to FIG. 14, or any aspect related to it. Note that reference to a processor performing a function of communications device 1500 may include one or more processors 1510 performing that function of communications device 1500.

In the depicted example, computer-readable medium/memory 1545 stores code (e.g., executable instructions), such as code for encoding 1550, code for outputting 1555, code for obtaining 1560, code for processing 1565, code for soft combining 1570, and code for performing 1575. Processing of the code for encoding 1550, code for outputting 1555, code for obtaining 1560, code for processing 1565, code for soft combining 1570, and code for performing 1575 may cause the communications device 1500 to perform the method 1300 described with respect to FIG. 13, or any aspect related to it; and the method 1400 described with respect to FIG. 14, or any aspect related to it.

The one or more processors 1510 include circuitry configured to implement (e.g., execute) the code stored in the computer-readable medium/memory 1545, including circuitry for encoding 1515, circuitry for outputting 1520, circuitry for obtaining 1525, circuitry for processing 1530, circuitry for soft combining 1535, and circuitry for performing 1540. Processing with circuitry for encoding 1515, circuitry for outputting 1520, circuitry for obtaining 1525, circuitry for processing 1530, circuitry for soft combining 1535, and circuitry for performing 1540 may cause the communications device 1500 to perform the method 1300 described with respect to FIG. 13, or any aspect related to it; and the method 1400 described with respect to FIG. 14, or any aspect related to it.

Various components of the communications device 1500 may provide means for performing the method 1300 described with respect to FIG. 13, or any aspect related to it; and the method 1400 described with respect to FIG. 14, or any aspect related to it. For example, means for transmitting, sending or outputting for transmission may include transceivers 354 and/or antenna(s) 352 of the UE 104 illustrated in FIG. 3, transceivers 332 and/or antenna(s) 334 of the BS 102 illustrated in FIG. 3, and/or the transceiver 1585 and the antenna 1590 of the communications device 1500 in FIG. 15. Means for receiving or obtaining may include transceivers 354 and/or antenna(s) 352 of the UE 104 illustrated in FIG. 3, transceivers 332 and/or antenna(s) 334 of the BS 102 illustrated in FIG. 3, and/or the transceiver 1585 and the antenna 1590 of the communications device 1500 in FIG. 15.

Example Clauses

Implementation examples are described in the following numbered clauses:

Clause 1: A method for wireless communications at a first wireless node, comprising: encoding different payloads, using polar codes, to generate multiple codeword permutations, wherein each of the different payloads comprises a first payload portion that is the same for the different payloads and a second payload portion that differs among the different payloads in a deterministic manner, and each codeword permutation corresponds to one of the second payload portions; and outputting the multiple codeword permutations sequentially.

Clause 2: The method of Clause 1, wherein: the different payloads correspond to physical broadcast channel (PBCH) transmissions; and the second payload portions correspond to system frame number (SFN) values conveyed in the PBCH transmissions.

Clause 3: The method of any one of Clauses 1-2, wherein the second payload portions correspond to counter values that change in a deterministic manner in different payloads.

Clause 4: The method of Clause 3, wherein: the outputting comprises outputting a first codeword permutation corresponding to a first counter value and, subsequently, outputting a second codeword permutation corresponding to a second counter value; and the second codeword permutation is generated by applying a permutation matrix to the first codeword permutation.

Clause 5: The method of Clause 4, wherein the permutation matrix is associated with a matrix formed by a first matrix that has low-triangular (LT) properties and a second matrix that has anti-diagonal upper-triangular (ADT) properties.

Clause 6: The method of Clause 4, wherein: each codeword permutation comprises one or more information bits and one or more frozen bits; and counter bits are treated as frozen bits when generating the first and second codeword permutations.

Clause 7: The method of Clause 6, wherein: the multiple codeword permutations are generated using a permutation matrix; and the permutation matrix is associated with one or more restrictions on one or more locations of the one or more frozen bits, the one or more information bits or the one or more frozen bits and the one or more information bits.

Clause 8: The method of Clause 7, wherein the one or more restrictions include a restriction that at least one pair of bit locations used for frozen bits or used for the information bits.

Clause 9: The method of Clause 4, wherein the generating comprises performing a non-linear operation on at least one bit location prior to applying the permutation matrix.

Clause 10: The method of Clause 9, wherein the non-linear operation involves at least one counter bit.

Clause 11: A method for wireless communications at a first wireless node, comprising: obtaining multiple codeword permutations corresponding to different payloads, wherein the different payloads comprise first payload portions that are the same and second payload portions that differ in a deterministic manner, and each codeword permutation corresponds to one of the second payload portions; processing the multiple codeword permutations to obtain the second payload portions; obtaining the first payload portions after obtaining the second payload portions; and soft combining of the first payload portions.

Clause 12: The method of Clause 11, wherein: the different payloads correspond to physical broadcast channel (PBCH) transmissions; and the second payload portions correspond to system frame number (SFN) values conveyed in the PBCH transmissions.

Clause 13: The method of any one of Clauses 11-12, wherein the second payload portions correspond to counter values that change in a deterministic manner in different payloads.

Clause 14: The method of Clause 13, wherein: each codeword permutation comprises one or more information bits and one or more frozen bits; and counter bits are treated as information bits when processing the multiple codeword permutations.

Clause 15: The method of Clause 13, wherein obtaining the first payload portions comprises: identifying an inverse transform associated with one of the second payload portions; and applying the inverse transform.

Clause 16: The method of Clause 15, wherein the inverse transform is associated with a matrix formed by a first matrix that has low-triangular (LT) properties and a second matrix that has anti-diagonal upper-triangular (ADT) properties.

Clause 17: The method of any one of Clauses 11-16, wherein the processing of the multiple codeword permutations to obtain the second payload portions involves a non-linear operation.

Clause 18: The method of Clause 17, wherein: the second payload portions correspond to counter values that change in a deterministic manner in different payloads; and the non-linear operation involves at least one counter value bit.

Clause 19: The method of Clause 15, further comprising performing an error check operation after applying the inverse transform.

Clause 20: The method of Clause 15, wherein the identification of the inverse transform associated with one of the second payload portions comprises mapping decoded bits of a second payload to a permutation index.

Clause 21: The method of Clause 15, wherein the application of the inverse transform results in a depermutation of a codeword permutation.

Clause 22: An apparatus, comprising: at least one memory comprising executable instructions; and at least one processor configured to execute the executable instructions and cause the apparatus to perform a method in accordance with any one of Clauses 1-21.

Clause 23: An apparatus, comprising means for performing a method in accordance with any one of Clauses 1-21.

Clause 24: A non-transitory computer-readable medium comprising executable instructions that, when executed by at least one processor of an apparatus, cause the apparatus to perform a method in accordance with any one of Clauses 1-21.

Clause 25: A computer program product embodied on a computer-readable storage medium comprising code for performing a method in accordance with any one of Clauses 1-21.

Clause 26: A network node (e.g., a network entity such as a gNB), comprising: at least one transceiver; at least one memory comprising executable instructions; and at least one processor configured to execute the executable instructions and cause the wireless node to perform a method in accordance with any one of Clauses 1-10, wherein the at least one transceiver is configured to transmit the codeword permutations.

Clause 27: A network node (e.g., a UE), comprising: at least one transceiver; at least one memory comprising executable instructions; and at least one processor configured to execute the executable instructions and cause the network node to perform a method in accordance with any one of Clauses 11-21 wherein the at least one transceiver is configured to receive the codeword permutations.

Additional Considerations

The preceding description is provided to enable any person skilled in the art to practice the various aspects described herein. The examples discussed herein are not limiting of the scope, applicability, or aspects set forth in the claims. Various modifications to these aspects will be readily apparent to those skilled in the art, and the general principles defined herein may be applied to other aspects. For example, changes may be made in the function and arrangement of elements discussed without departing from the scope of the disclosure. Various examples may omit, substitute, or add various procedures or components as appropriate. For instance, the methods described may be performed in an order different from that described, and various actions may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The various illustrative logical blocks, modules and circuits described in connection with the present disclosure may be implemented or performed with a general purpose processor, a graphics processing unit (GPU), a neural processing unit (NPU), a digital signal processor (DSP), an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, a system on a chip (SoC), or any other such configuration.

As used herein, the term wireless node may refer to a type of network node, for example, a network entity or a user equipment (UE). In this context, a network entity may be a base station (e.g., a gNB) or a module (e.g., a CU, DU, and/or RU) of a disaggregated base station.

While the present disclosure may describe certain operations as being performed by one type of wireless node, the same or similar operations may also be performed by another type of wireless node. For example, operations performed by a network entity may also (or instead) be performed by a UE. Similarly, operations performed by a UE may also (or instead) be performed by a network entity.

Further, while the present disclosure may describe certain types of communications between different types of wireless nodes (e.g., between a network entity and a UE), the same or similar types of communications may occur between same types of wireless nodes (e.g., between network entities or between UEs, in a peer-to-peer scenario). Further, communications may occur in reverse direction relative to what is described (e.g., a UE could transmit a request to a network entity and the network entity transmits a response; OR a network entity could transmit the request to a UE and the UE transmits the response).

As used herein, "a processor," "at least one processor" or "one or more processors" generally refers to a single processor configured to perform one or multiple operations or multiple processors configured to collectively perform one or more operations. In the case of multiple processors, performance of the one or more operations could be divided amongst different processors, though one processor may perform multiple operations, and multiple processors could collectively perform a single operation. Similarly, "a memory," "at least one memory" or "one or more memories" generally refers to a single memory configured to store data and/or instructions, multiple memories configured to collectively store data and/or instructions.

Means for encoding, means for outputting, means for obtaining, means for processing, and means for soft combining may comprise one or more processors, such as one or more of the processors described above with reference to FIG. 15.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more actions for achieving the methods. The method actions may be interchanged with one another without departing from the scope of the claims. In other words, unless a specific order of actions is specified, the order and/or use of specific actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Software shall be construed broadly to mean instructions, instruction sets, code, code segments, program code, programs, subprograms, software modules, applications, software applications, software packages, routines, subroutines, objects, executables, threads of execution, procedures, or functions, whether referred to as software, firmware, middleware, microcode, hardware description language, or otherwise.

The following claims are not intended to be limited to the aspects shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112 (f) unless the element is expressly recited using the phrase "means for". All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An apparatus for wireless communication, comprising:
at least one memory comprising computer-executable instructions; and
one or more processors configured to execute the computer-executable instructions and cause the apparatus to:
encode different payloads, using polar codes, to generate multiple codeword permutations, wherein each of the different payloads comprises a first payload portion that is the same for the different payloads and a second payload portion that differs among the different payloads in a deterministic manner, and each codeword permutation corresponds to one of the second payload portions,
wherein the second payload portions correspond to counter values that change in a deterministic manner in different payloads,
wherein, in order to output the multiple codeword permutations sequentially, the one or more processors are further configured to output a first codeword permutation corresponding to a first counter value and, subsequently, output a second codeword permutation corresponding to a second counter value, and
wherein the second codeword permutation is generated by applying a permutation matrix to the first codeword permutation; and
output the multiple codeword permutations sequentially.

2. The apparatus of claim 1, wherein the different payloads correspond to physical broadcast channel (PBCH) transmissions; and the second payload portions correspond to system frame number (SFN) values conveyed in the PBCH transmissions.

3. The apparatus of claim 1, wherein the permutation matrix is associated with a matrix formed by a first matrix that has low-triangular (LT) properties and a second matrix that has anti-diagonal upper-triangular (ADT) properties.

4. The apparatus of claim 1, wherein:
each codeword permutation comprises one or more information bits and one or more frozen bits; and
counter bits are treated as frozen bits when generating the first and second codeword permutations.

5. The apparatus of claim 4, wherein:
the multiple codeword permutations are generated using the permutation matrix; and
the permutation matrix is associated with one or more restrictions on one or more locations of the one or more frozen bits, the one or more information bits, or the one or more frozen bits and the one or more information bits.

6. The apparatus of claim 5, wherein the one or more restrictions include a restriction that at least one pair of bit locations used for frozen bits or used for the information bits.

7. The apparatus of claim 1, wherein in order to generate the second codeword permutation, the one or more processors are further configured to perform a non-linear operation on at least one bit location prior to applying the permutation matrix.

8. The apparatus of claim 7, wherein the non-linear operation involves at least one counter bit.

9. The apparatus of claim 1, further comprising at least one transceiver configured to transmit the multiple codeword permutations sequentially, wherein the apparatus is configured as a network entity.

10. An apparatus for wireless communication, comprising:

at least one memory comprising computer-executable instructions; and one or more processors configured to execute the computer-executable instructions and cause the apparatus to:

obtain multiple codeword permutations corresponding to different payloads, wherein the different payloads comprise first payload portions that are the same and second payload portions that differ in a deterministic manner, and each codeword permutation corresponds to one of the second payload portions, wherein:

the different payloads correspond to physical broadcast channel (PBCH) transmissions, and the second payload portions correspond to system frame number (SFN) values conveyed in the PBCH transmissions;

process the multiple codeword permutations to obtain the second payload portions;

obtain the first payload portions after obtaining the second payload portions; and soft combine the first payload portions.

11. The apparatus of claim 10, wherein the second payload portions correspond to counter values that change in a deterministic manner in different payloads.

12. The apparatus of claim 11, wherein:

each codeword permutation comprises one or more information bits and one or more frozen bits; and counter bits are treated as information bits when processing the multiple codeword permutations.

13. The apparatus of claim 11, wherein in order to obtain the first payload portions, the one or more processors are further configured to:

identify an inverse transform associated with one of the second payload portions; and apply the inverse transform.

14. The apparatus of claim 13, wherein the inverse transform is associated with a matrix formed by a first matrix that has low-triangular (LT) properties and a second matrix that has anti-diagonal upper-triangular (ADT) properties.

15. The apparatus of claim 13, wherein the one or more processors are further configured to cause the apparatus to:

perform an error check operation after applying the inverse transform.

16. The apparatus of claim 13, wherein in order to identify the inverse transform associated with one of the second payload portions, the one or more processors are further configured to map decoded bits of a second payload to a permutation index.

17. The apparatus of claim 13, wherein the application of the inverse transform results in a depermutation of a codeword permutation.

18. The apparatus of claim 10, wherein, in order to process the multiple codeword permutations to obtain the second payload portions, the one or more processors are further configured to perform a non-linear operation.

19. The apparatus of claim 18, wherein:

the second payload portions correspond to counter values that change in a deterministic manner in different payloads; and the non-linear operation involves at least one counter value bit.

20. The apparatus of claim 10, further comprising at least one transceiver configured to receive the multiple codeword permutations, wherein the apparatus is configured as a user equipment (UE).

21. A method for wireless communication at a network node, comprising:

obtaining multiple codeword permutations corresponding to different payloads, wherein the different payloads comprise first payload portions that are the same and second payload portions that differ in a deterministic manner, and each codeword permutation corresponds to one of the second payload portions, wherein:

the different payloads correspond to physical broadcast channel (PBCH) transmissions, and the second payload portions correspond to system frame number (SFN) values conveyed in the PBCH transmissions;

processing the multiple codeword permutations to obtain the second payload portions;

obtaining the first payload portions after obtaining the second payload portions; and soft combining the first payload portions.

* * * * *